(12) United States Patent
Parazzoli et al.

(10) Patent No.: US 11,150,609 B1
(45) Date of Patent: Oct. 19, 2021

(54) TRAPPED ION PLATFORM WITH OPTICAL INPUT AND OUTPUT

(71) Applicant: National Technology & Engineering Solutions of Sandia, LLC, Albuquerque, NM (US)

(72) Inventors: Lambert Paul Parazzoli, Albuquerque, NM (US); Daniel L. Stick, Albuquerque, NM (US); Christopher T. DeRose, Albuquerque, NM (US); Michael Gehl, Albuquerque, NM (US); Randolph R. Kay, Albuquerque, NM (US); Matthew G. Blain, Albuquerque, NM (US)

(73) Assignee: National Technology & Engineering Solutions of Sandia, LLC, Albuquerque, NM (US)

( * ) Notice: Subject to any disclaimer, the term of this patent is extended or adjusted under 35 U.S.C. 154(b) by 0 days.

(21) Appl. No.: 17/030,889

(22) Filed: Sep. 24, 2020

Related U.S. Application Data

(60) Provisional application No. 62/905,835, filed on Sep. 25, 2019.

(51) Int. Cl.
*G04F 5/14* (2006.01)
*G02F 1/035* (2006.01)
*H01J 49/42* (2006.01)
*H03L 7/26* (2006.01)
*G06N 10/00* (2019.01)

(52) U.S. Cl.
CPC .............. *G04F 5/14* (2013.01); *G02F 1/0356* (2013.01); *H01J 49/422* (2013.01); *H01J 49/424* (2013.01); *H03L 7/26* (2013.01); *G06N 10/00* (2019.01)

(58) Field of Classification Search
CPC ... H03L 7/26; G04F 5/14; G06N 10/00; H01J 49/422; H01J 49/0018; H01J 49/424; B82Y 10/00; B81B 7/0067
See application file for complete search history.

(56) References Cited

U.S. PATENT DOCUMENTS 7,859,350 B1 * 12/2010 Schwindt ................. G04F 5/14
331/94.1

FOREIGN PATENT DOCUMENTS

WO WO2021006811 A1 * 1/2021 ............. G06N 10/00

OTHER PUBLICATIONS

Lucas, D. M., et al. "Isotope-selective photoionization for calcium ion trapping." Physical Review A 69.1 (2004): 012711. (Year: 2004).*
West, Gavin N., et al. "Low-loss integrated photonics for the blue and ultraviolet regime." Apl Photonics 4.2 (2019): 026101. (Year: 2019).*

(Continued)

Primary Examiner — Ryan Johnson
(74) Attorney, Agent, or Firm — Martin I. Finston

(57) ABSTRACT

In disclosed apparatus, a plurality of optical waveguides monolithically integrated on a surface ion trap substrate deliver light to the trapping sites. Electrical routing traces defined in one or more metallization levels deliver electrical signals to electrodes of the surface electrode ion trap. A plurality of photodetectors are integrated on the substrate and arranged to detect light from respective trapping sites.

20 Claims, 18 Drawing Sheets

(56) References Cited

OTHER PUBLICATIONS

Shu, Gang, et al. "Efficient fluorescence collection and ion imaging with the "tack" ion trap." JOSA B 28.12 (2011): 2865-2870. (Year: 2011).*

McLoughlin, James J., et al. "Versatile ytterbium ion trap experiment for operation of scalable ion-trap chips with motional heating and transition-frequency measurements." Physical Review A 83.1 (2011): 013406. (Year: 2011).*

Aslan, M.M. et al., "Low-Loss Optical Waveguides for the Near Ultra-Violet and Visible Spectral Regions with Al2O3 Thin Films from Atomic Layer Deposition," Thin Solid Films, 2010, vol. 518, pp. 4935-4940.

Borregaard, J. and Sorensen, A. "Efficient atomic clocks operated with several atomic ensembles," Physical Review Letters, 2013, vol. 111, .090802.

Derose, C. T. et al., "Ultra compact 45 GHz CMOS compatible Germanium waveguide photodiode with low dark current," Opt Express, 2011, vol. 19, pp. 24897-24904.

Derose, C. T. et al., "High speed traveling wave carrier depletion silicon Mach-Zehnder modulator," Optical Interconnects Conference, Santa Fe, NM, 2012.

De Rose, C. T "Silicon microring modulator with integrated heater and temperature sensor for thermal control," in CLEO, 2010.

Jau, Y, et al., "Low-power, miniature Yb-171 ion clock using an ultra-small vacuum package," Applied Physics Letters, 2012, vol. 101, 253518.

Jones, A.M. et al., "Ultra-low crosstalk, CMOS compatible waveguide crossings for densely integrated photonic interconnection networks", Optics Express, 2013, vol. 21, pp. 12002-12013.

Lentine, A. L. and Derose, C. "Silicon Photonics for National Security Applications," IEEE, 2015.

Lentine, A. L. et al., "Active wavelength control of silicon microphotonic resonant modulators," in Optical Interconnects Conference, 2012.

Martinez, N.J.D. et al., "Single photon detection in a waveguide-coupled Ge-on-Si lateral avalanche photodiode," Optics Express, 2017, vol. 25, pp. 16130-16139.

Tamm, et al., "171Yb+ Single-Ion Optical Frequency Standard at 688 THz," IEEE Trans. on Instrumentation, and Measurement, 2007, vol. 46, pp. 601-604.

Schioppo, M. et al., "Ultrastable optical clock with two cold-atom ensembles," Nature Photonics, 2016, vol. 11, pp. 48-55.

Schwindt, P.D.D. et al., "A highly miniaturized vacuum package for a trapped ion atomic clock," Review of Scientific instruments, 2016, vol. 87, 053112.

Manginel, R. P. et al., "In situ dissolution or deposition of Ytterbium (Yb) metal in microhotplate wells for a miniaturized atomic clock," Optics Express, 2012, vol. 20, 24650.

Stenger, J. et al., "Absolute frequency measurement of the 435.5-nm 171Yb+-clock transition with a Kerr-lens mode-locked femtosecond laser," Optics Letters, 2001, vol. 26, pp. 1589-1591.

Weigel, P. O.et al., "Hybrid Silicon Photonic-Lithium Niobate Electro-Optic Mach-Zehnre Beyond 100 GHz," Arxiv, 2018, pp. 1-18.

Zortman, W. "Low voltage differentially signaled modulators," Optics Express, 2011, vol. 19, pp. 26017-26026.

Brewer, S. M. et al., "A high-accuracy mobile Al+ optical clock",2014 IEEE International Frequency Control Symposium (FCS).

Dube, P. et al., "Evaluation of systematic shifts of the 88Sr+ single-ion optical frequency standard at the 10-17 level," Physical Review A, vol. 87, 023806, 2013.

Dube, P. et al., "Electric Quadrupole Shift Cancellation in Single-Ion Optical Frequency Standards", Physical Review Letters, 2005, vol. 95, 33001.

Itano, W.M., et al., "Quantum projection noise: Population fluctuations in two-level systems", Physical Review A, 1993, vol. 47, p. 3554-3570.

Katzenmeyer, A.M. et al., "Volumetric Imaging and Characterization of Focusing Waveguide Grating Couplers",. IEEE Photonics Journal, 2017, vol. 9, 2701009.

Keller, J. et al., "Probing Time Dilation in Coulomb Crystals in a high-precision Ion Trap", Physical Review Applied, 2019, vol. 11, 011002.

Kielpinski, D.C., et al., "Architecture for a large-scale ion-trap quantum computer", Nature, 2002, vol. 417, pp. 709.

Lalau-Keraly, C.M. Lalau-Keraly et al., "Adjoint shape optimization applied to electromagnetic design," Optic Express, 2013, vol. 21, pp. 21693-21701.

Maunz, P. "High Optical Access Trap 2.0," SAND2016-0796R, Sandia National Laboratories (Jan. 26, 2016).

Mehta, K.K. and Ram, R.J.,"Precise and diffraction-limited waveguide-to-free-space focusing gratings". Scientific Reports, 2017, vol. 7, p. 2019.

Moehring, D.L., et al., "Design, fabrication and experimental demonstration of junction surface ion traps", New Journal of Physics, 2011, vol. 13, 075018.

Niffenegger, R. J. et al., "Integrated optical control and enhanced coherence of ion qubits via multi-wavelength photonics," arXiv.org, arXiv:2001.05052 (2020).

Payne, F.P. and Lacey, J.P.R.,"A theoretical analysis of scattering loss from planar optical waveguides", Optical and Quantum Electronics, 1994, vol. 26, pp. 977-986.

Rosenband, T. and Leibrandt, D. R. "Exponential scaling of clock stability with atom number", 2013, arXiv:1303.6357v2.

Savchenkov, A.A. et al., "Stabilization of a Kerr frequency comb oscillator", Optics Letters, 2013, vol. 38, p. 2636-2639.

Schneider, T., E. Peik, and Tamm, C. "Sub-Hertz Optical Frequency Comparisons between Two Trapped 171Yb+ Ions", Physical Review Letters, 2005, vol. 94, p. 230801.

Schwindt, P.D.D., et al., "MiniSature trapped-ion frequency standard with 171Yb +", 2015, Joint Conference of the IEEE International Frequency Control Symposium & the European Frequency and Time Forum.

Scherer, R. et al., "Progress on a Miniature Cold-Atom Frequency Standard", 2014, ARXIV, https://arxiv.org/ftp/arxiv/papers/1411/1411.5006.pdf.

Sebby-Strabley, J., C. et al., "Design innovations towards miniaturized GPS-quality clocks", 2016, IEEE International Frequency Control Symposium (IFCS).

Shappert, C.M et al., "Spatially uniform single-qubit gate operations with near-field microwaves and composite pulse compensation" New Journal of Physics, 2013, vol. 15, 083053.

Warren, W.S. et al., "Multiple phase-coherent laser pulses in optical spectroscopy. I. The technique and experimental applications",. The Journal of Chemical Physics, 1983, vol. 78, pp. 2279-2297.

Xuan, Y. et al., High-Q silicon nitride microresonators exhibiting low-power frequency comb initiation,. Optica, 2016, vol. 3 pp. 1171-1180.

* cited by examiner

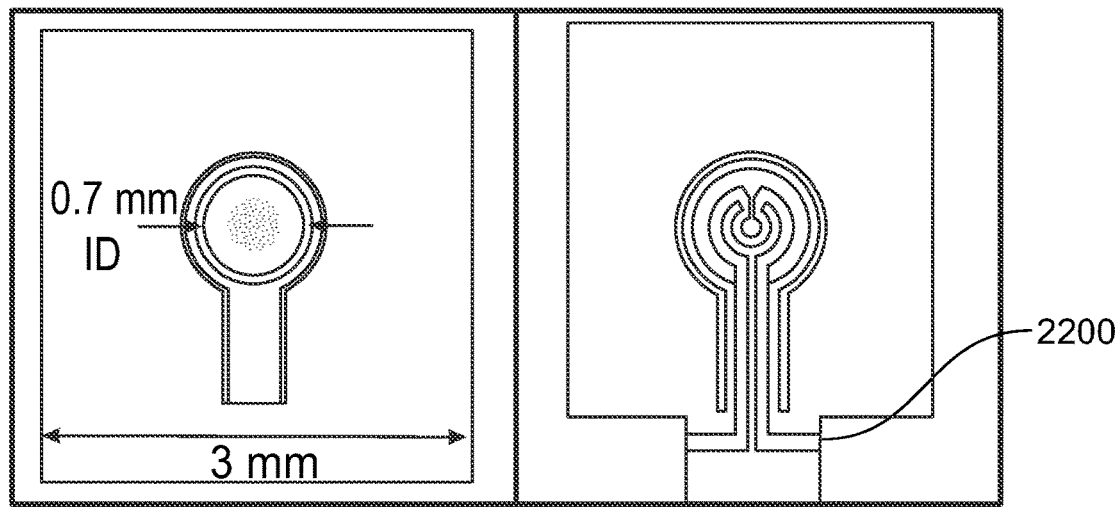
FIG. 22A  FIG. 22B
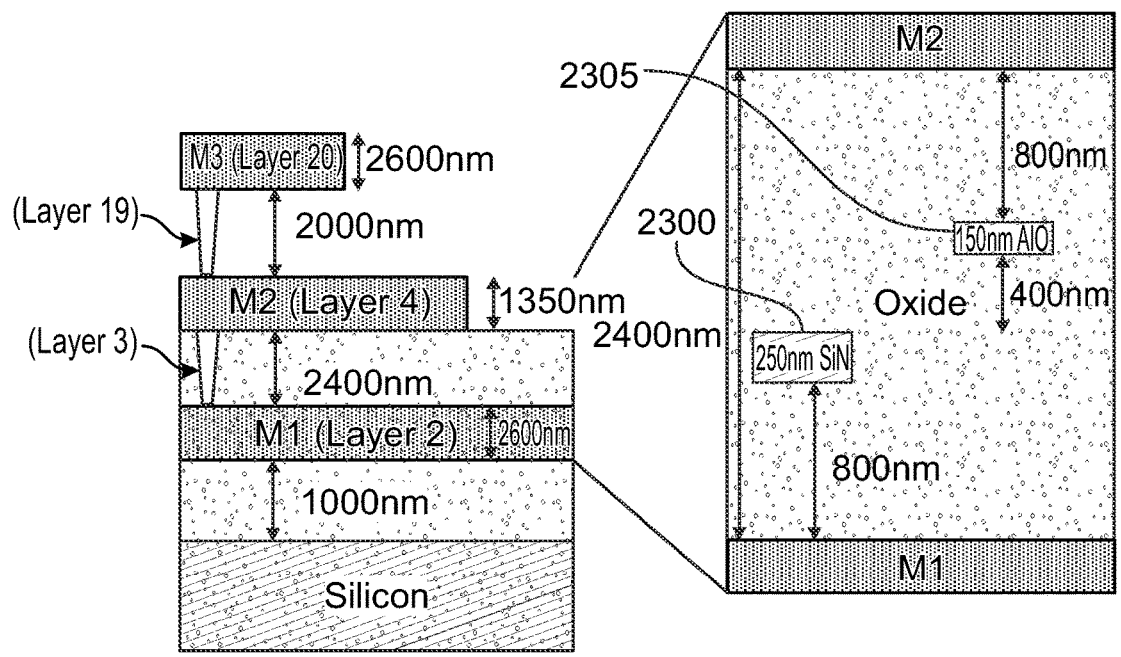
FIG. 23

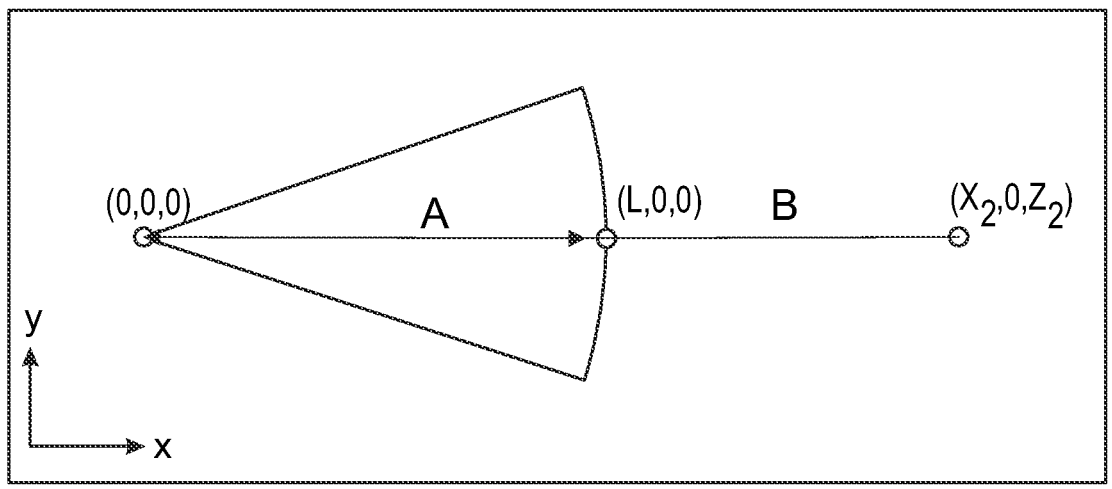
$A = n_{eff} \times L \qquad A + B = m\lambda$
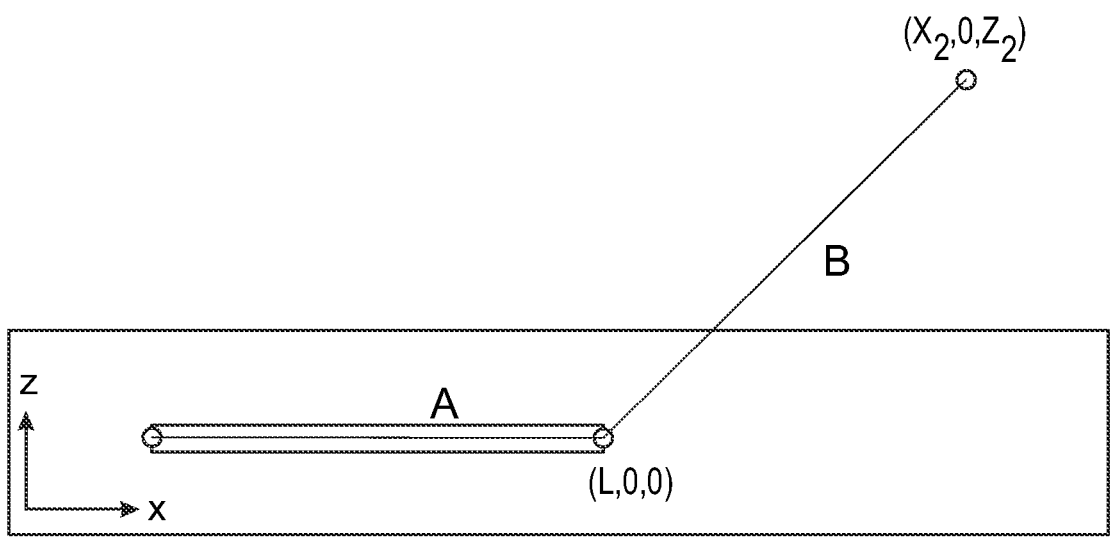
FIG. 34

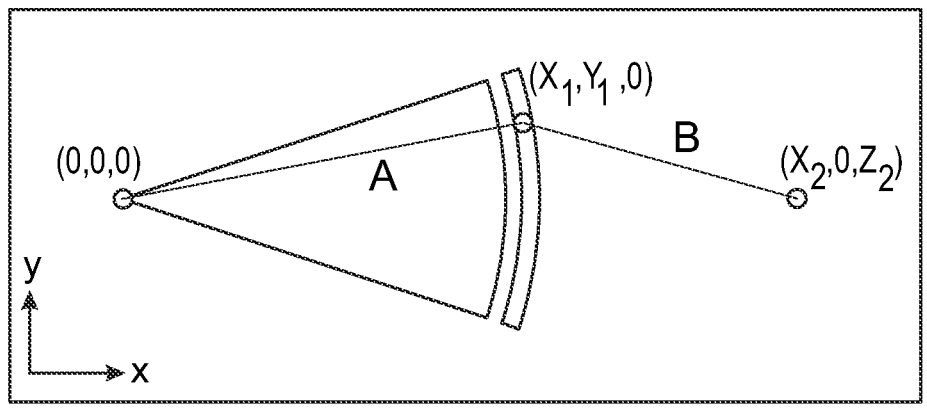
$A = n_{eff} \times L + (DC \times n_{eff} + (1 - DC) \times n_{cladding}) \times \left(\sqrt{X_1^2 + Y_1^2} - L\right)$    $A + B = (m + 1)\lambda$
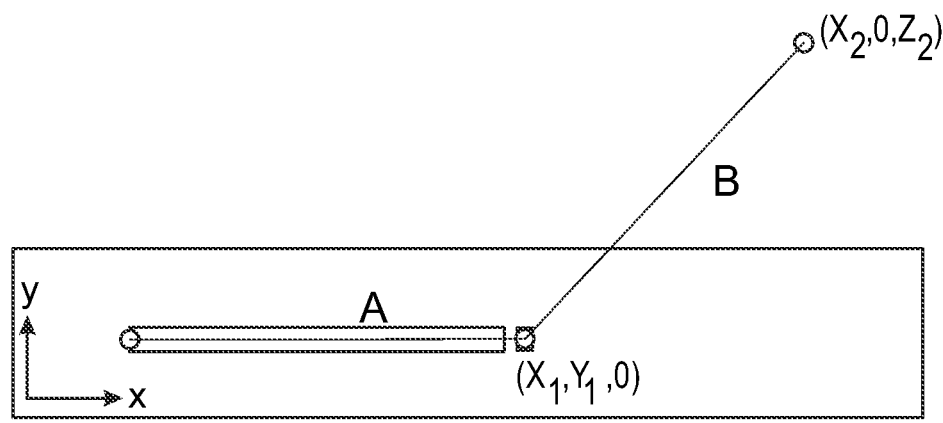
FIG. 35

… … …

TRAPPED ION PLATFORM WITH OPTICAL INPUT AND OUTPUT

CROSS-REFERENCE TO RELATED APPLICATION

This application claims the benefit of U.S. Provisional Application No. 62/905,835, filed Sep. 25, 2019, the entirety of which is hereby incorporated herein by reference.

STATEMENT OF GOVERNMENT INTEREST

This invention was made with Government support under Contract No. DE-NA0003525 awarded by the United States Department of Energy/National Nuclear Security Administration. The U.S. Government has certain rights in the invention.

FIELD OF THE INVENTION

The invention relates to atomic clocks.

ART BACKGROUND

In recent years, there has been increasing interest in the development of atomic clocks in which the frequency reference is provided by an optical transition of an atom or ion. Several different methods have been attempted for isolating and maintaining the host atomic systems. These include ion traps, optical lattices, and magneto-optical traps. Microfabricated surface ion traps are of especial interest in this regard because they are highly manufacturable, their performance is repeatable due to the lithographic electrode definitions, and they can trap and manipulate many single ions within a trap array.

In a surface ion trap, individual ions are confined by superposed electrostatic and radio frequency (RF) fields. The technology of ion traps was first developed for applications in mass spectrometry. The development of this technology has accelerated recently, because of the realization that an ensemble of trapped atomic ions is a promising host system for the operations that underlie quantum computation.

Surface ion traps offer new opportunities to design atomic clocks that are both accurate and portable.

SUMMARY OF THE INVENTION

Described here is a new platform based on a surface ion trap. Because such a platform can hold large numbers of ions simultaneously in individual trapping sites, it lends itself to statistical averaging techniques that can be used to enhance the accuracy of, e.g., an optically controlled atomic clock.

One potential benefit of the new platform is that it may be possible to miniaturize it enough to make it portable. Such a requirement, however, places heavy demands on the packaging technology, because many connections are needed for electrical and optical input and output. We have addressed those demands by integrating both electrical routing and optical routing directly on the trap chip.

More specifically, electrical routing is required for at least the trap RF electrodes, the dc control electrodes, and the bias and signal lines for the photodetectors. Optical routing is needed for the laser beams that provide the clock signal, laser cooling, and excitation for readout operations and repump and ionization processes.

By way of illustration, the example we describe here, which uses $^{171}\text{Yb}^+$ as the host system, requires five colors of light: A 435-nm clock beam, a 369-nm Doppler and detection beam, a 765-nm repump beam, a 935-nm repump beam, and a 399-nm photoionization beam. A plurality of integrated waveguides is provided for routing of these wavelengths.

In addition, photodetectors are needed to read out the atomic states of the trapped ions and thereby create an error signal for the clock. For that purpose, we integrate an array of single-photon avalanche detectors (SPADs) directly on the trap chip. Further electrical lines read the output from the photodetectors.

As a further aid to miniaturization, the vacuum package for the ion traps consists of a cap directly bonded to the ion trap chip. Electrical lines fan out through the vacuum interface to the periphery of the trap chip outside of the vacuum enclosure. There, wirebond pads are provided for electrical connection. Optical connections are likewise made outside the vacuum enclosure, for example by using fiber V-groove arrays in the periphery of the chip. This approach eliminates the need for feedthroughs and free-space optics.

It should be borne in mind that the use of $^{171}\text{Yb}^+$ as the host system is described here only as a non-limiting example. As those skilled in the art will understand, there are a variety of other ionic species that can serve as alternative host systems in this context.

Accordingly, the invention in one aspect relates to apparatus in which a surface electrode ion trap is fabricated on a substrate and conformed to provide a plurality of trapping sites for ionic host systems such as, but not limited to, $^{171}\text{Yb}^+$ ions. A plurality of optical waveguides is monolithically integrated on the substrate and conformed to deliver light to the trapping sites. A plurality of electrical routing traces defined in one or more metallization levels is integrated on the substrate and conformed to deliver electrical signals to electrodes of the surface electrode ion trap. A plurality of photodetectors is integrated on the substrate and arranged to detect light from respective trapping sites. In an embodiment described below, the apparatus is an optically controlled atomic clock.

In embodiments, there are waveguides for a plurality of ultraviolet beams and other waveguides for a plurality of infrared beams. The ultraviolet beams may include beams for a clock signal, for Doppler cooling, for detection, and for photoionization. The infrared beams may include repump beams. In embodiments, the ultraviolet waveguides have alumina cores, and the infrared waveguides have silicon nitride cores.

In embodiments, the ultraviolet waveguides and the infrared waveguides are each embedded within an intermetal dielectric layer. In some embodiments, the ultraviolet and infrared waveguides are embedded at different heights within the same intermetal dielectric layer. In other embodiments, they are embedded within different intermetal dielectric layers.

In embodiments, the photodetectors are single-photon avalanche detectors (SPADs), which may be monolithically integrated on the substrate, for example below respective trapping sites. In embodiments, each photodetector integrated on the substrate is formed in a silicon device layer of the substrate, and each photodetector is positioned at the bottom of an aperture so as to have, in operation, a direct line of sight to an ion trapped above the aperture.

In embodiments, a vacuum vessel is directly bonded to the substrate, with plural waveguide terminations defined in the substrate outside the vacuum vessel and plural wirebond pads formed on the substrate outside the vacuum vessel and connected by vias to buried metallization layers. In embodiments, the waveguide terminations are adapted for coupling buried waveguides to optical fibers.

In embodiments, at least one metal reflector is monolithically integrated on the substrate and arranged to enhance optical coupling of one or more of the optical waveguides to one or more of the trapping sites.

In embodiments, at least some of the monolithically integrated optical waveguides are terminated by grating couplers, each of which is adapted to couple light out of its respective waveguide and to form the outcoupled light into a beam directed to a trapping site.

In embodiments, the trapping sites are arranged in at least two arrays for respective ensembles of trapped ions, and the plurality of monolithically integrated optical waveguides comprises, for each of the arrays, at least one trunk waveguide and a plurality of branch waveguides. The trunk waveguide is for delivering light to its array, and the branch waveguides are for delivering light from the trunk waveguide to individual trapping sites of the array.

In a second aspect, the invention relates to a method of operating an optically controlled atomic clock apparatus of the kind described above. According to such a method, a plurality of ions confined at respective trapping sites is interrogated using light delivered thorough a plurality of optical waveguides monolithically integrated on the substrate, and fluorescence from those ions is detected using a plurality of photodetectors integrated on the substrate and arranged to detect light from respective trapping sites. In embodiments, the interrogating is performed concurrently over an ensemble of two or more of the confined ions.

BRIEF DESCRIPTION OF THE DRAWINGS

FIG. 8 is similar to FIG. 5, but some details are complementary between the two figures.

FIG. 22A is a view of the backside of an example micro-hotplate according to an example embodiment. Visible in the figure is a cup structure with an inside diameter of 0.7 mm.

FIG. 22B is a view of the micro-hotplate of the preceding figure, showing the silicon micro-hotplate cup structure with a low-resistance Pt/ZnO heating wire.

FIG. 23 is a cross-sectional schematic drawing of an example prototype of an ion-trap platform according to the principles discussed here.

FIGS. 34 and 35 illustrate selected steps in a design procedure for diffractive grating couplers useful in the practice of the ideas presented here.

DETAILED DESCRIPTION

Described here is a highly integrated photonic-atomic ion clock using multiple ytterbium ions confined on a surface ion trap. Optical ion clocks have demonstrated exceptional stability and accuracy. As a host atom, the $^{171}$Yb$^+$ ion is a promising candidate for a transportable clock that requires balancing the ultimate performance with size, weight, and power (SWAP) considerations.

Ion-trapping technologies suitable for trapping $^{171}$Yb$^+$ ions, among others, are known. One such technology, which can be adapted for the purposes described here, is the technology of linear surface radio-frequency (RF) traps, such as the HOA-2 trap designed by Sandia National Laboratories. A description of the HOA-2 technology can be found, for example, in P. Maunz, "High Optical Access Trap 2.0," SAND2016-0796R, Sandia National Laboratories (Jan. 26, 2016), the entirety of which is hereby incorporated herein. Other technologies may also be similarly adapted.

Figure 1:
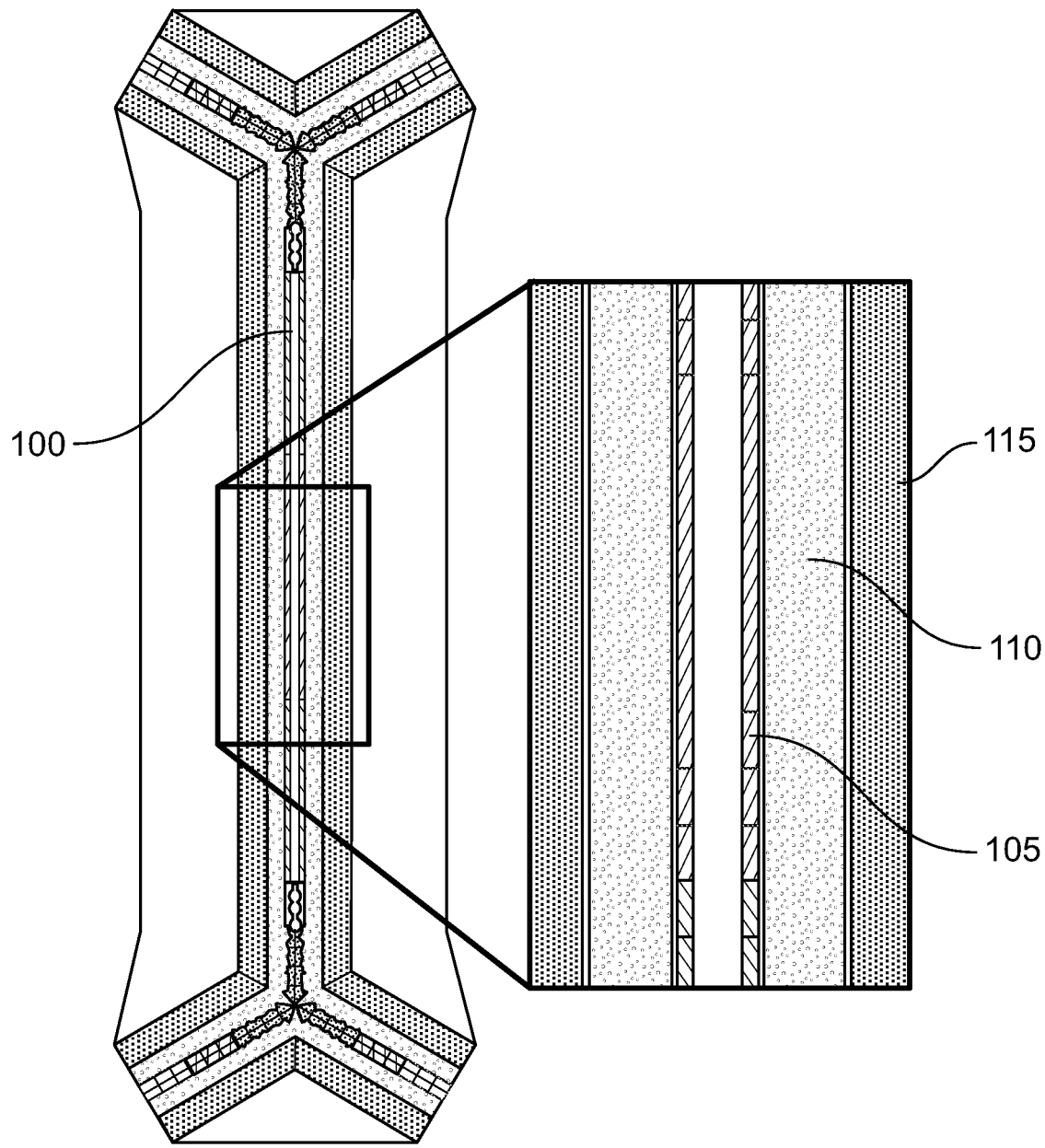
FIG. 1 is a simplified schematic drawing, in plan view, of a typical linear surface RF trap of the prior art.

FIG. 1 is a simplified schematic drawing, in plan view, of a typical linear surface RF trap. As best seen in the inset to the figure, the central axis 100 where ion trapping takes place is bounded on each side by dc control electrodes 105, RF electrodes 110, and dc compensation electrodes 115. The ions are loaded into the trapping sites from loading holes, which are not shown in the figure. The loading hole positions are offset from the trapping site positions.

In addition to the trapping electrodes, our new trap chip includes waveguides for light delivery and input couplers for interfacing with fibers that deliver laser light from off-chip sources. The trap chip could also include modulators for controlling light intensity.

In our current design, the photodetectors are monolithically integrated below the trap to read out the states of individual ions. In alternative designs, the detectors may be added by hybrid integration.

Figure 2:
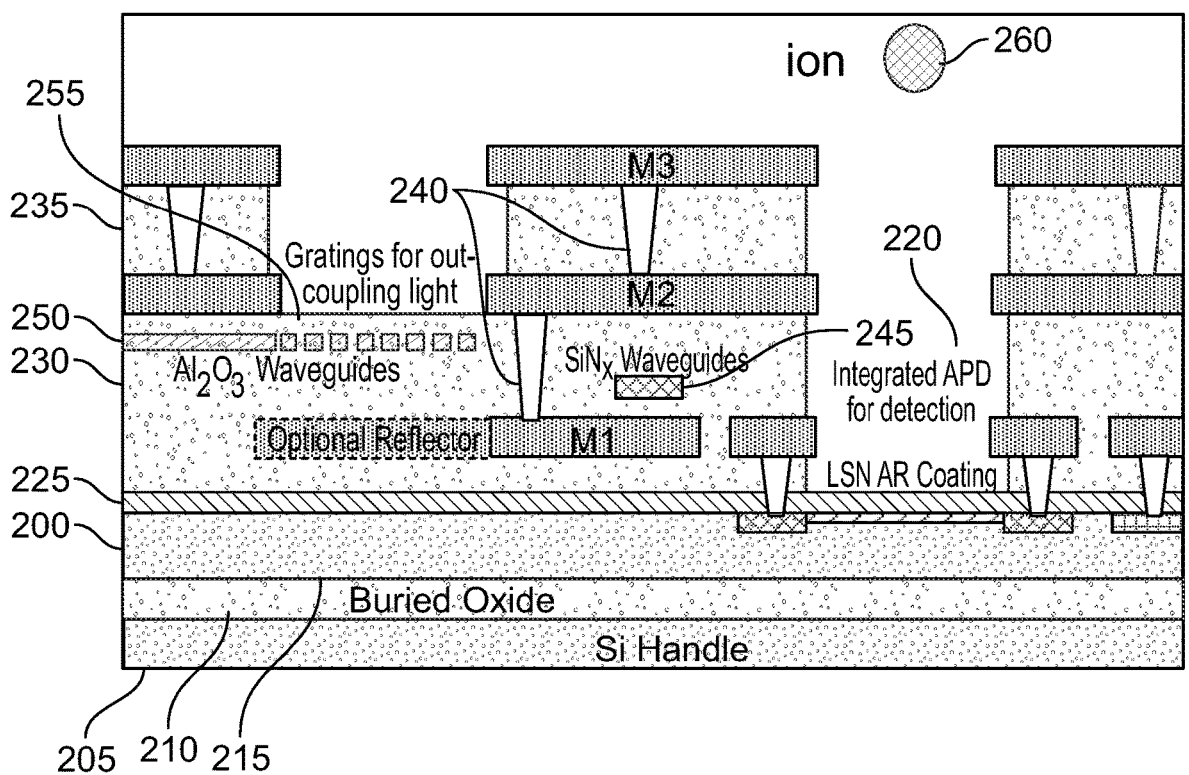
FIG. 2 is a schematic cross-sectional view of a new trap design according to the principles discussed herein, in an example embodiment.

FIG. 2 is a schematic cross-sectional view of our new trap design in an example embodiment. As seen in the figure, an SOI substrate 200 includes a silicon handle layer 205, a buried oxide layer 210, and a silicon device layer 215 in which a monolithically integrated photodetector 220 is shown. An optional antireflection layer 225 of low-stress silicon nitride overlies the photodetector. Three layers of metallization, respectively labeled M1, M2, and M3 are shown, with levels 230, 235 of intermetal dielectric of silicon oxide between them. The metal layers are interconnected by metal vias 240.

Waveguides are embedded at two levels within the intermetal dielectric between M1 and M2. Silicon nitride waveguides 245 are at one level, and alumina waveguides 250 are at the other level. As shown in the figure for the alumina waveguide, gratings 255 formed at the output ends of the waveguides out-couple light into beams directed at the trapping site where trapped ion 260 is shown.

With further reference to the drawing, it will be seen that the trapped ion is confined at a height above the top metal M3, and that there is a direct, vertical line of sight from the trapped ion to the photodetector.

As noted above, the device described here utilizes a multiplicity of trapped ions of the host atom. Utilizing many ions in the operation of the atomic clock offers several advantages, including an increase by a factor of 4N in the signal to noise ratio (SNR), where N is the number of trapped ions that are interrogated.

The many-ion approach can also enable separate and staggered interrogation. This is advantageous because it can eliminate dead time, which is a significant error source in atomic clocks. The many-ion approach can also make it possible to designate selected ions for monitoring and correcting for systematic shifts, such as those caused by magnetic fields.

Another important benefit of our approach is that different ensembles of ions can be interrogated on different timescales. Thus, for example, both a short-timescale feedback loop and a long-timescale feedback loop can be used to stabilize the local oscillator, leading to improvements in overall stability. A typical short timescale could, for example, be on the order of 100 μs, whereas a typical long timescale could be on the order of 1 ms. In effect, two or more clocks are operated on a common platform. The concurrent operation of two atomic clocks of conventional design for purposes of stabilization is possible in principle, but there are practical obstacles because of the prohibitive size of conventional atomic clocks. Our design overcomes these obstacles.

Figure 3:
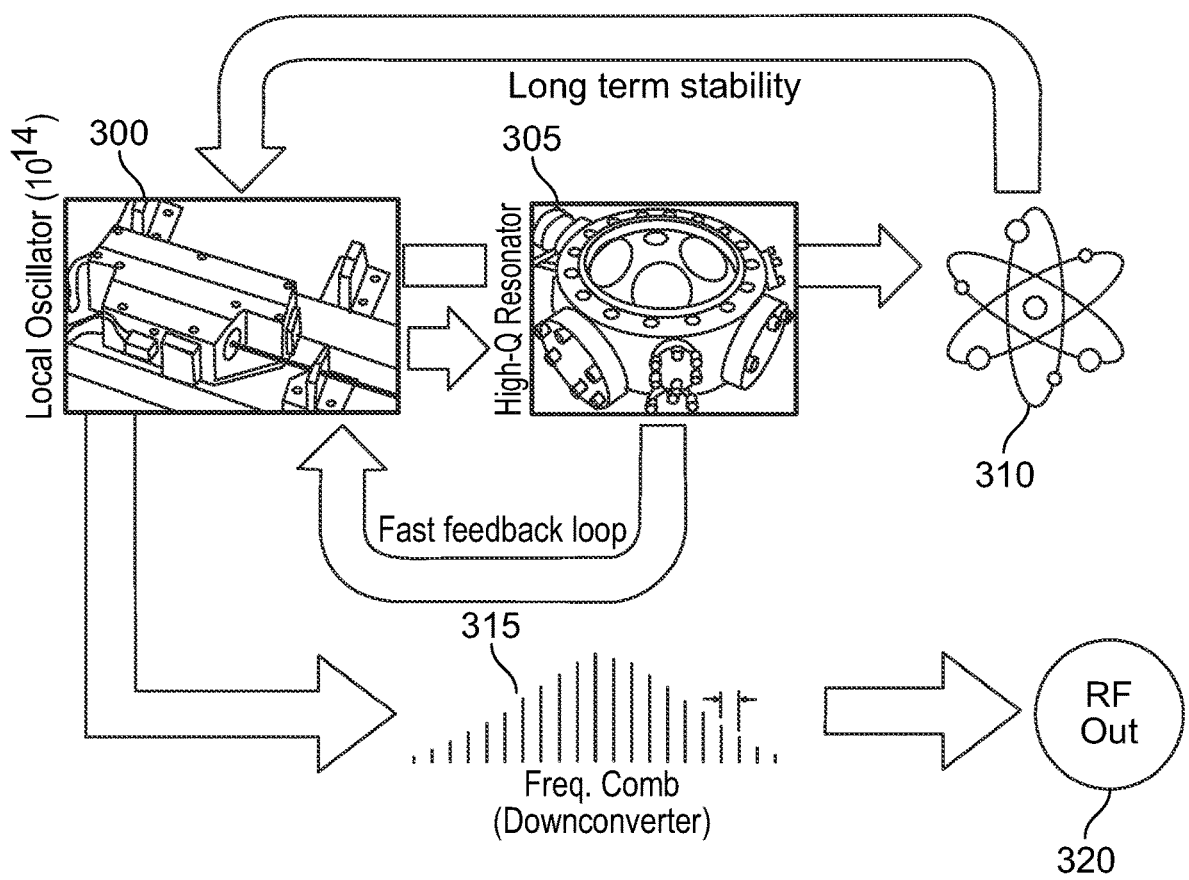
FIG. 3 is a flowchart, providing an overview of atomic clock operation.

FIG. 3 is a flowchart, providing an overview of typical atomic clock operation. As seen, a laser 300 serving as local oscillator (LO) is stabilized on the shortest timescale by an external, high-Q, optical resonator 305. On the longer term, the LO is stabilized by interrogation of the host atomic system 310. The stabilized LO output is downconverted from an optical frequency to an RF frequency through the use of a frequency comb 315. The downconverted RF signal 320 is the clock output.

Ytterbium was chosen as the host atomic system for the example embodiment described here because it has several favorable properties. These include a vanishing linear Zeeman shift, which leads to long coherence times and magnetic field insensitivity. Another favorable property is high atomic mass, which dramatically increases trap lifetimes and reduces the impact of electric field noise. Yet another favorable property is a set of optical transitions at wavelengths that are amenable to photonic integration.

The clock transition in this example is the $^2S_{1/2}$ (F=0, $m_F$=0)→$^2D_{3/2}$ (F=2, $m_F$=0) transition at 435.5 nm in the $^{171}$Yb$^+$ ion, which has a 3-Hz Lorentzian linewidth and enables instabilities of less than $10^{-14}$.

Figure 4:
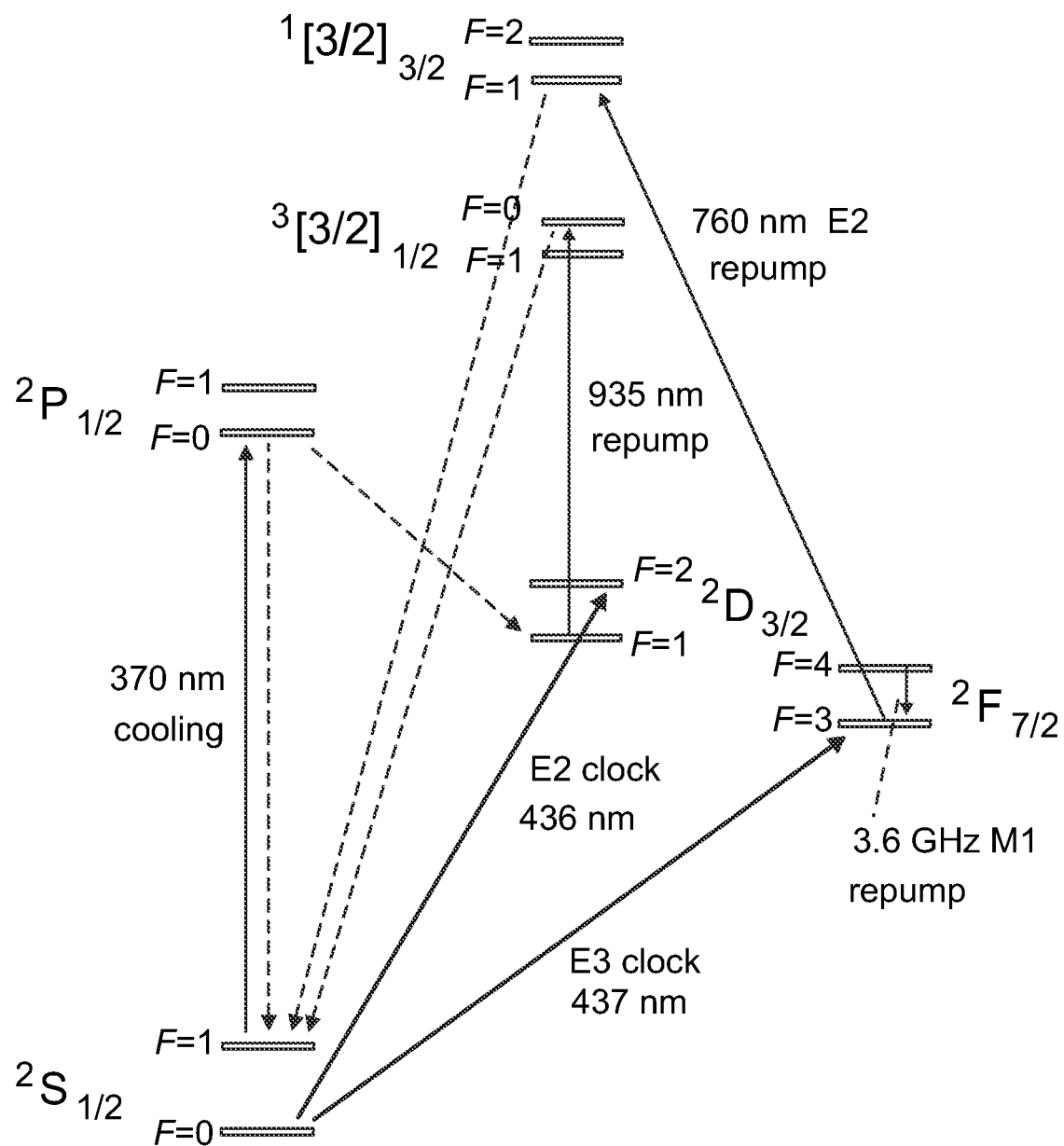
FIG. 4 is an atomic energy-level diagram showing the transitions among hyperfine levels of $^{171}Yb^+$ that are involved when $^{171}Yb^+$ serves as a host system for an atomic clock as described here.

The level structure of the $^{171}$Yb$^+$ ion is shown in FIG. 4.

Until now, most demonstrations of optical ion clocks have used only a single ion, because it is difficult to control systematic shifts when multiple ions are used. By using a multi-ion approach, however, we believe we can bring about a great improvement in stability.

That is, we believe our multi-ion approach can reduce the stability requirement for the local oscillator (LO) by more than an order of magnitude while maintaining a clock instability scaling of better than $10^{-14}/\sqrt{\tau}$, where τ represents the measurement time. Thus, according to our belief, an optical LO can be pre-stabilized to a high-Q micro-resonator with an instability of $10^{-13}$.

In a preferred mode of operation, an interrogation is performed with two pulses of light at the clock wavelength. The first pulse of light is a π/2 pulse that places the ionic ensemble in a superposition of the two quantum states corresponding to the clock transition, and the second pulse is another π/2 pulse that transfers the ionic ensemble to one of the two states.

This combination of pulses is referred to as a "Ramsey" sequence. However, the different ion ensembles can be operated with different interrogation schemes. For example, the fast ensembles, which provide a lower-resolution error signal, can be interrogated with Rabi spectroscopy (using a single a pulse), which requires less laser power than the Ramsey method.

In a device designed according to our multi-ion approach, there are multiple regions, exemplarily linear arrangements, of ion traps. Individual modulators deliver both the Ramsey pulses and the light used for cooling and detection to each ion site, using waveguides and diffractive out-couplers for optical transport.

For detection, the fluorescence from each ion is collected by an aperture in the trap for delivery to an individual detector.

Figure 5:
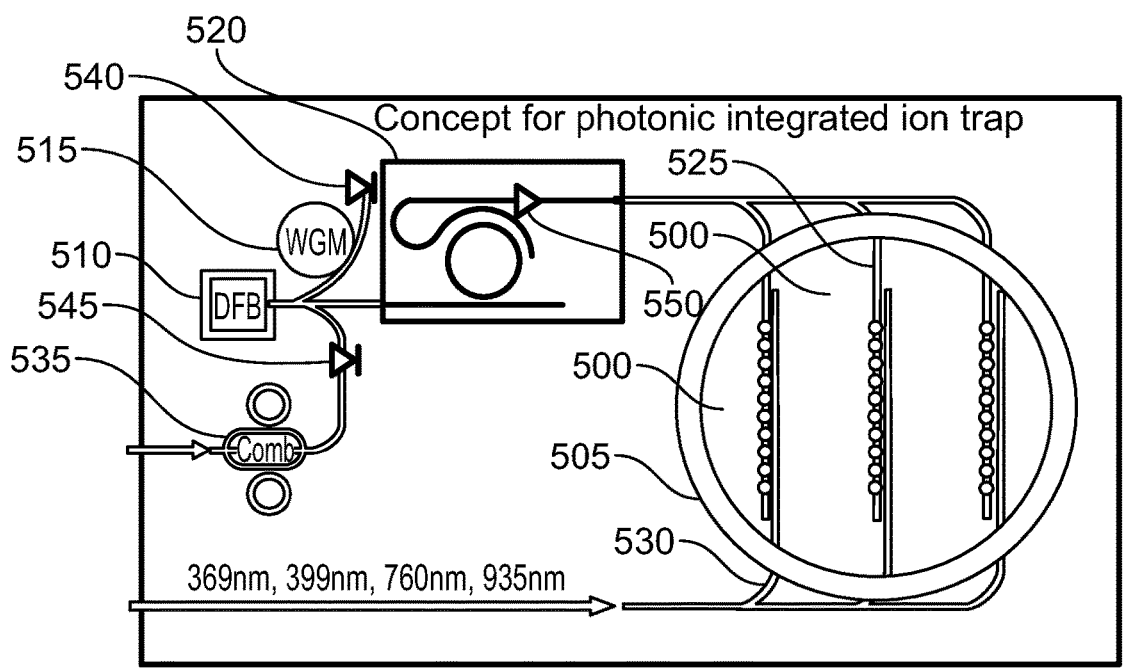
FIG. 5 is a simplified schematic diagram showing an ion trap as described here, in context within an atomic clock system.

FIG. 5 is a simplified schematic diagram showing the ion trap in context within an atomic clock system. Three linear arrays 500 of trapped ions are shown in the drawing. In embodiments, each of these arrays could constitute an ionic ensemble. The trapping region is sealed within a vacuum chamber. The vacuum seal is represented in the drawing by an annular region 505.

With further reference to the figure, the local oscillator is the distributed feedback (DFB) laser 510 shown at left. It is stabilized by an external optical resonator 515 which in this example is a whispering gallery mode (WGM) resonator. A frequency doubler 520 is shown between the DFB laser and the trap. Separate laser sources, not shown explicitly in the figure, provide the light at wavelengths of, in this example, 369 nm, 399 nm, 760 nm, and 935 nm that are seen entering the trap from the lower left.

In our example, the DFB laser emits light at a wavelength of 871 nm, which is frequency doubled. For brevity, we refer to the frequency-doubled wavelength in this discussion by the rounded figure of 435 nm. A typical optical power level for the DFB laser output prior to doubling is 40 mW. The output from the frequency doubler will have a typical optical power of 2 mW. Generally, the output from the frequency doubler will be amplified, for example by a semiconductor optical amplifier (SOA) or injection-locked laser, producing an output with a typical power of 50 to 100 mW.

With further reference to the figure, each linear array of trapping sites is shown disposed along a trunk waveguide 525 for distributing the clock light for interrogating the ions and a trunk waveguide 530 for distributing the light for re-pumping, cooling, and photoionization. This representation is a conceptual and highly simplified view of a distribution architecture that can be useful in specific embodiments and that is described below in greater detail.

With still further reference to the figure, it will be seen that the optical output of the local oscillator is processed using a frequency comb 535 to produce a down-converted RF output signal.

Also shown in the figure are photodiode detectors 540, 545 and an optical amplifier 550. Diode 545 measures the beat note between the DFB laser and a comb line to produce the downconverted RF output signal. Diode 540 is a power monitor for locking the DFB laser to the whispering gallery mode resonator. This diode measures how much light is transmitted through the resonator. The measurement provides the error signal for locking the laser to the resonator.

As noted above, there are several advantages to the use of multiple ions. More specifically, using N ions improves the signal-to-noise ratio (SNR) over the single ion shot noise limit of 1 by a factor of $\sqrt{N}$. It also makes the system more robust to ion loss, since the SNR drops marginally for a single ion loss from $\sqrt{N}$ to $\sqrt{(N-1)}$, rather than from 1 to 0 for a single ion.

Further, with multiple ions it is possible to operate with several different Ramsey interrogation times. This can potentially achieve greater clock stability by stabilizing the LO with progressively longer interrogation times.

Still further, the detection times can be staggered, thereby eliminating error associated with clock dead time and reducing the cycle time.

With individual ions confined within their own respective trapping potentials, important systematic effects for each ion can be controlled. Examples of such effects are the second-order Doppler shift and the electric quadrupole shift. Moreover, the function of each ion can be alternated between clock operation and environmental monitoring (i.e., monitoring of magnetic and electric fields) at each trap site. Specific ions can also be dedicated for systematic monitoring. Accordingly, the majority of ions can be participating in the clock operation, while a few are instead being used to monitor relevant environmental conditions.

Another advantage is that the clock can be operated with multiple ensembles of ions. This is useful, not least, because it helps to stabilize the local oscillator (LO). As noted above, there can be individual and independent interrogation of multiple single ions. One consequence is that the time r between Ramsey pulses can be different for each ensemble. Each ensemble can then be used to stabilize the LO. This can reduce the LO unlocked stability requirement by as much as an order of magnitude, potentially leading to a much more manufacturable system.

An additional advantage of multiple ensembles is that, if interrogation times can vary among the several ensembles, then the interrogation time for some of the ensembles can be faster than would be possible in a system with a single interrogation time. The faster interrogation time has the benefit of making the clock more robust to vibration.

Figure 6:
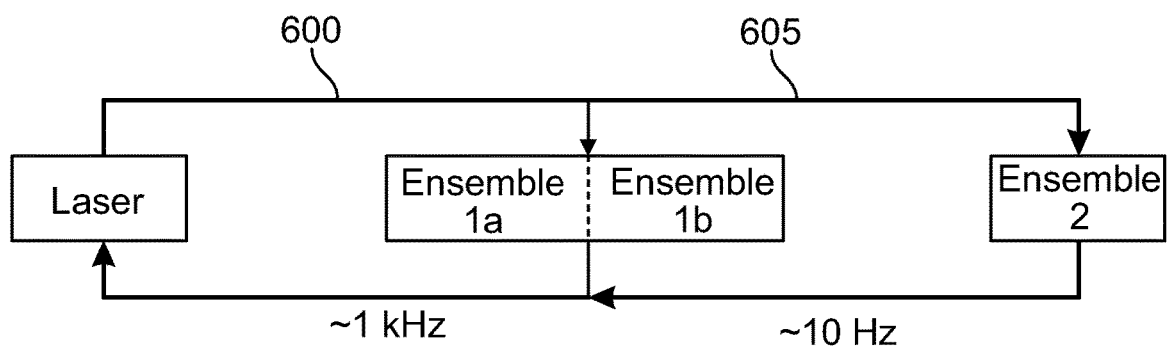
FIG. 6 is a schematic diagram of an optical feedback chain that stabilizes the clock laser in an example embodiment as described herein. An approximate value for an appropriate loop bandwidth is indicated in the figure beneath each arm of the feedback chain.
Figure 7:
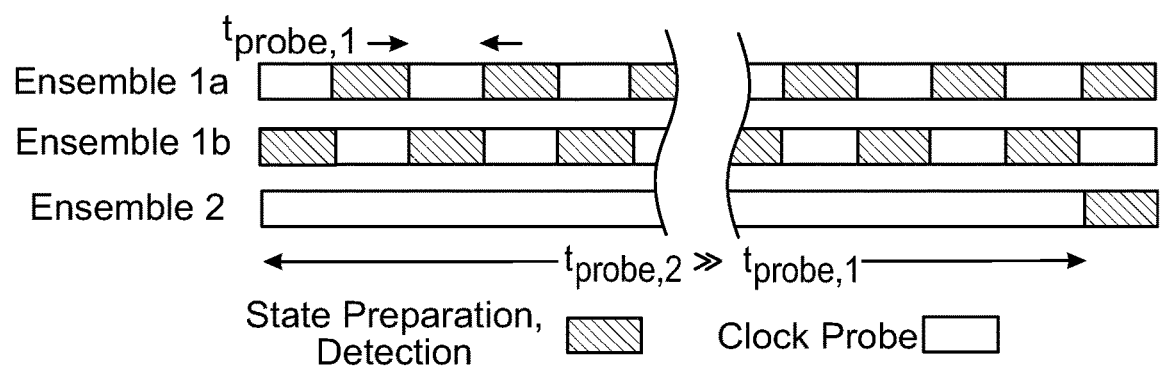
FIG. 7 is a timing diagram that illustrates a probe sequence for the atoms in the respective ensembles labeled 1a, 1b and 2 according to an example embodiment as described herein.

A simple example of a multi-ion clock protocol which could be implemented with our system is illustrated in FIGS. 6 and 7. FIG. 6 is a schematic diagram of the optical feedback chain that stabilizes the clock laser. There is a fast lock of the clock laser to an external microcavity, which is not shown in the figure. The stabilization represented in the figure is derived from two separate servos and is based on the atomic interrogation signal. As indicated in the figure, the left arm 600 of the chain has an approximate loop bandwidth of 1 kHz, and the right arm 605 of the chain has an approximate loop bandwidth of 10 Hz.

FIG. 7 shows a probe sequence for atoms in the ensembles labeled 1a, 1b, and 2 in the figure. Interleaved dead-time-free probes of ensembles 1a and 1b are used to extend the laser coherence time for ensemble 2.

Figure 8:
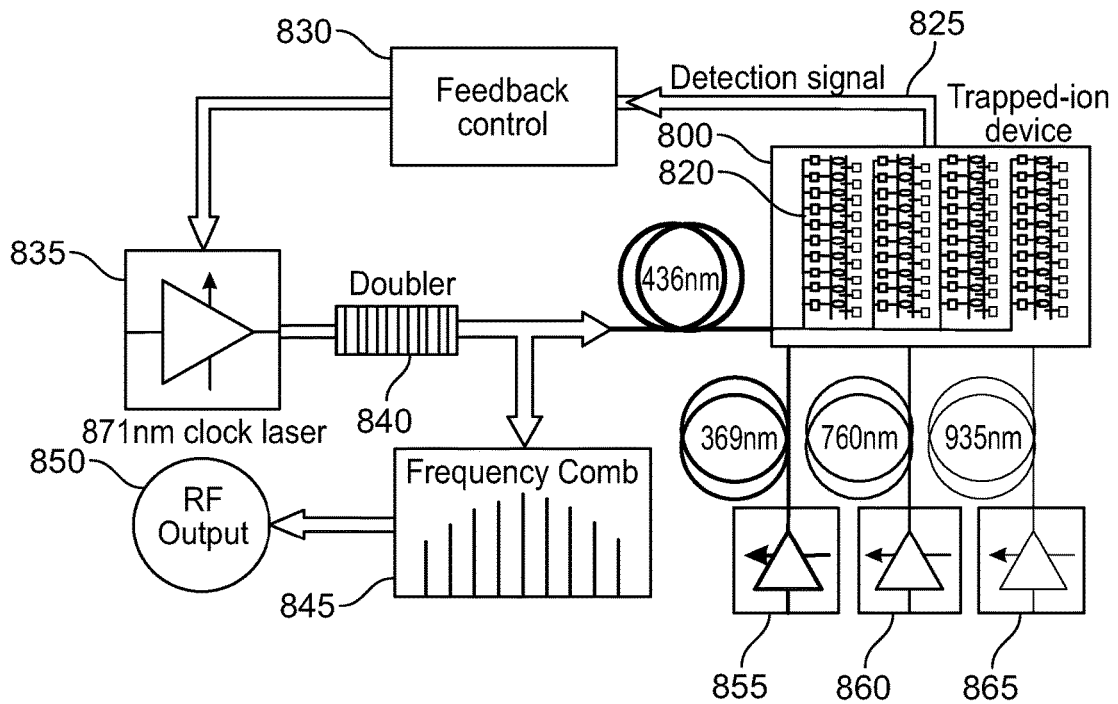
FIG. 8 is a block diagram of an example system for an atomic clock as described herein in a notional overview.

A notional overview of the proposed system is shown in FIG. 8. FIG. 8 is similar to FIG. 5, but some details are complementary between the two figures. A surface electrode ion trap 800 confines and interrogates multiple ensembles of ytterbium ions. The trapping sites for the ions are arranged so that for each irradiating wavelength or group of similar wavelengths, a trunk waveguide feeds each ensemble and branches out to the individual trapping sites using optical splitters. In the drawing, the trapping sites for the respective ionic ensembles are shown arranged in linear arrays, but this should be understood as merely illustrative and not as limiting.

Waveguides 820 are integrated into the trap platform with diffractive out-couplers to direct light onto the ions. We have found it advantageous to use focusing grating couplers that can produce small beam waists, preferable beam waists as small as 2 μm. The small beam waist helps to minimize the total optical power delivered to the physics package. This is especially beneficial for the local oscillator source, where the small beam waist will allow for faster optical transitions.

Single photon avalanche photodiodes (SPADs), not shown in the drawing, are monolithically integrated below the traps to read out the states of the individual ions with high efficiency.

A detection signal 825 from the SPADs is directed to feedback control 830. The feedback control is used to stabilize clock laser 835, which in this example emits at a wavelength of 871 nm.

Frequency doubler 840 doubles the clock laser output to the wavelength of the clock transition, which in this example is 435 nm.

Frequency comb 845 is used to produce a radio-frequency (RF) output signal 850 that is downconverted from the clock laser output for precise frequency counting.

Laser 855, which in this example emits at 369.5 nm, is used for Doppler cooling as well as for exciting the fluorescence used for state detection.

Repump lasers 860 and 865, which in this example emit at 765 nm and 935 nm, respectively, support detection and state preparation.

A further laser, not shown in the drawing, emits light at 399 nm to photoionize neutral ytterbium atoms to produce ytterbium ions.

It is noteworthy that by integrating the light delivery and state detection architecture, we have excluded all free-space optics from the clock, except where direct interaction with the ions is involved.

The total number of ions and the total number of ensembles that a clock would use is widely variable and dependent on the particular application. For a particular example, we believe that about fifty trapped ions would be sufficient to implement the multi-atom optical clock described here, although even fewer ions could possibly be useful for some applications, depending, among other things, on the short-term stability of the clock laser.

The Host Atomic System

Because the $^{171}$Yb$^+$ ion has a nuclear spin I=½, it also has a magnetic-field insensitive F=0 hyperfine sublevel, which makes it an attractive choice for a clock. As mentioned above, this also reduces the state-preparation stage to a simpler and quicker hyperfine pumping scheme. The relatively high atomic mass leads to smaller Doppler shifts at a given temperature, and it also leads to increased lifetime in the traps. Ytterbium consistently demonstrates some of the longest lifetimes in trapped-ion experiments.

The $^2S_{1/2} \rightarrow {}^2P_{1/2}$ Doppler cooling and fluorescence detection transition of $^{171}$Yb$^+$ is at 369.5 nm. It has a natural linewidth of $\gamma/2\pi$=19.60(5) MHz, which corresponds to a photon scattering rate of 56 MHz.

Because there is a small but significant probability of decaying to the $^2D_{3/2}$ state, a repump laser at 935 nm is required in order to maintain fluorescence.

Although it is optional, a second repump to depopulate the $^2F_{7/2}$ level can help improve ion storage times.

For efficient Doppler cooling, the light used for that purpose must contain a mixture of all polarizations ($\sigma^+$, $\sigma^-$, and $\pi$), although the ratios are not critical. Using an electro-optic modulator (EOM), 14.7-GHz sidebands are applied to the light during cooling and detection to pump out the lower hyperfine level via the $^2S_{1/2}$ (F=0)$\rightarrow {}^2P_{1/2}$ (F=1) transition. The clock operation uses the E2 clock transition at 435.5 nm; this transition has a 3-Hz Lorentzian linewidth that enables instabilities of less than $10^{-14}$.

Detection

The capability for a short detection time, for example a detection time of 30 µs, is desirable. To achieve it, the example design uses single-photon avalanche detectors (SPADs) that have a detection efficiency of greater than 0.2 to collect the ion fluorescence at 369 nm. Assuming, for example, an aperture of 40 µm×60 µm, the fraction of photons incident on the SPAD is 0.061, from which we estimate an average of 20 photons detected in the measurement window.

We have observed a dark count rate from prototypes of our APD in the range 1-10 kHz.

Dark count rate is important because it affects the detection infidelity. Infidelity decreases with the measurement time, but it increases with the dark count rate.

Allowing a dark count rate from the APD of 1 kHz and a detected scatter rate from the laser of 1 kHz, an average of 0.04 false photons detected per measurement window would be expected. Based on these values, and with a detection threshold of 2 counts, we estimate that a detection infidelity of $4 \times 10^{-6}$ in 30 µs can be achieved.

Integrated Surface Ion Trap

Microfabricated surface traps are good candidates for micro-ion clocks, because they are highly manufacturable, their performance is repeatable due to the lithographic electrode definitions, and they can trap and manipulate many single ions within a trap array.

The ion trap described here can be fabricated using known fabrication technologies in the field of silicon micro-electromechanical systems (MEMS).

It is noteworthy in this regard that in addition to being readily manufacturable, surface ion traps also perform repeatably because their electrodes are lithographically defined. Moreover, the traps are made by a back end-of-line (BEOL) process, which makes their fabrication compatible with many integrated technologies.

A trap chip can support many single-ion trapping sites, each of which can be independently compensated for electric fields. Ions can be loaded in a distant reservoir for on-demand replacement of lost ions. Ions can be moved in and out of interrogation and detection regions to further suppress the off state of the laser radiation illuminating them. Ion shuttling can also be used to share clock laser and detection/repump sites.

In operation, the surface electrode ion trap creates an array of electric potential wells with a characteristic length scale. An illustrative range for this length scale is 20-100 µm, and a typical value in our designs is 40 µm.

For the Yb ion, we calculate that we will be able to achieve well depths in the range of about 0.05 eV to about 0.2 eV.

Each ion is isolated in its own individual well. The wells are typically separated by about five electrodes. Separations between wells are typically on the order of 200 µm. Thus, motional coupling between ions is expected to be negligible.

The ions are radially confined by an RF pseudopotential with an amplitude of about 300 $V_{rms}$ driven at a frequency of about 50 MHz. The required RF power to achieve this voltage is typically in the range from about 200 mW to about 500 mW. The RF power is coupled via a miniaturized LC tank circuit. Lower-power operation can be realized through the use of capacitance-reducing techniques for the trap.

With these parameters, the radial secular frequency in examples is about 3 MHz, which would allow an axial secular frequency of about 1 MHz.

Integrated Light Delivery

As noted above, five colors of light are required in the example embodiment described here. Accordingly, five laser sources are integrated into the design: A 435-nm clock laser, a 369-nm laser for Doppler cooling and detection, a 765-nm repump laser, a 935-nm repump laser, and a 399-nm laser for the photoionization beam.

In addition, a single-photon avalanche detector (SPAD, also referred to below as an APD) is integrated below each pertinent trapping site for reading out the ionic state to create the error signal for the clock. During interrogation, the ions in a given ensemble are typically irradiated as a group, but their fluorescence is detected individually by their respective APDs.

In the example described here, the light is delivered to the multiple ionic ensembles by integrated waveguides arranged so that each ensemble is fed by a common trunk that branches out to the individual trapping sites for that ensemble.

In our current approach, two waveguide layers are integrated, at different heights, into the same intermetal dielectric level within the body of a surface ion trap: (a) the 369-nm Doppler beam, the 399-nm photoionization beams, and the 435-nm beam of clock light share an alumina waveguide core, and (b) the 935-nm and 760-nm repump beams share a silicon nitride waveguide layer. The light output from all of these waveguides is directed by grating couplers to the respective trapping sites.

It should be noted in this regard that in alternative designs, the photoionization beam may be delivered to a dedicated photoionization zone.

FIGS. 9-12 illustrate the coupling of a waveguide to a trapped ion.

Figure 9:
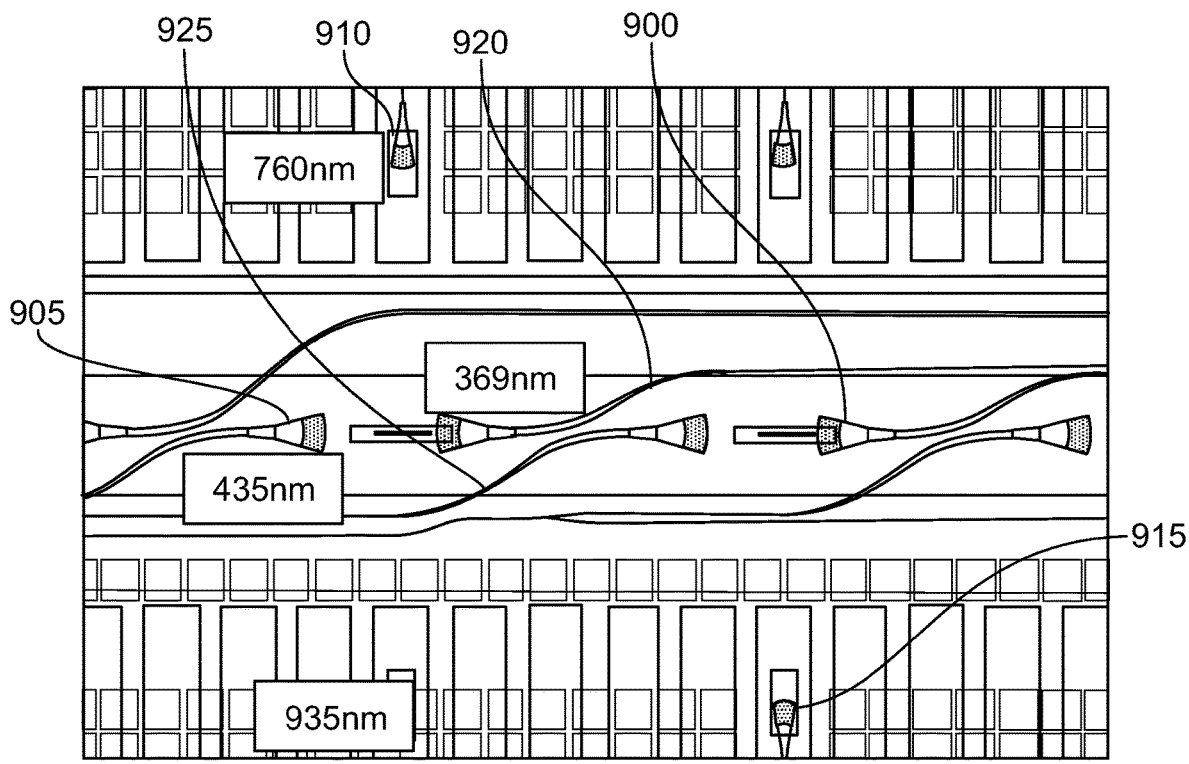
FIG. 9 is a rendering from an optical micrograph of a portion of a trap, showing several output gratings.

FIG. 9 is a rendering from an optical micrograph of a portion of a trap, showing several output gratings. Specifically, output gratings 900, 905, 910, and 915 for light at 369 nm, 435 nm, 760 nm, and 935 nm, respectively, are shown. Waveguides 920 and 925 for 369 nm and 435 nm, respectively, are also visible in the drawing.

Figure 10:
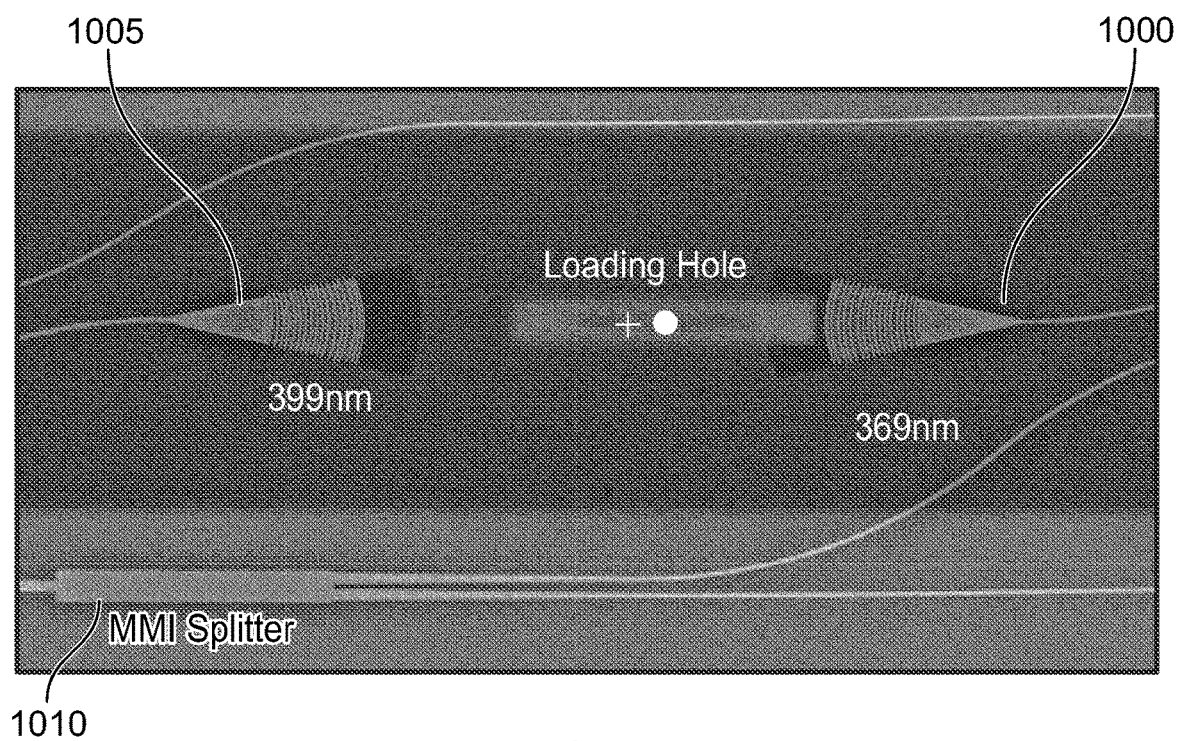
FIG. 10 is a detail of the device shown in FIG. 9, but at higher magnification.

FIG. 10 is a detail of the device shown in FIG. 9, but at higher magnification. FIG. 10 shows output gratings 1000 and 1005 for light at 369 nm and at 399 nm, respectively, together with portions of the associated waveguides and a multi-mode interference (MMI) optical splitter 1010 used for optical distribution from trunk waveguides to branch waveguides. Alternative optical splitting elements useful in this regard include directional couplers and adiabatic splitters.

Figure 11:
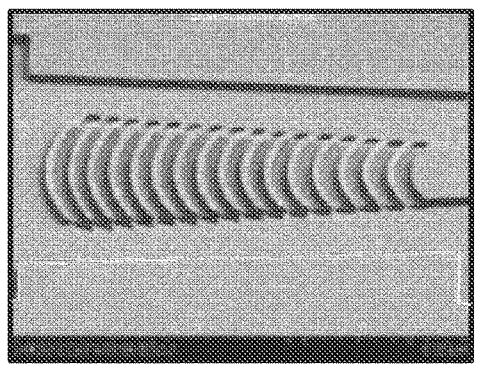
FIG. 11 is a rendering from a scanning electron micrograph of a curved focusing grating coupler integrated into a surface trap according to an example embodiment as described herein.
Figure 12:
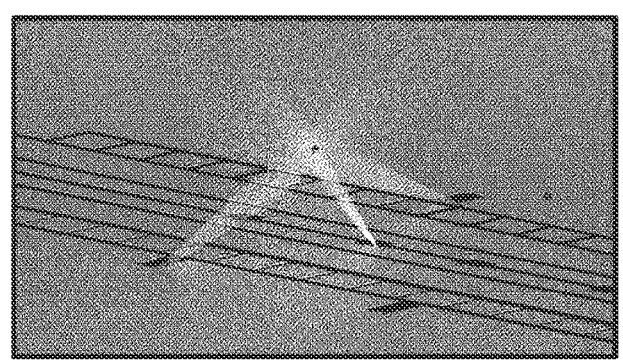
FIG. 12 is a perspective view showing the irradiation of a trapped ion by beams emerging from four respective apertures in the trap.

FIG. 11 is a rendering from a scanning electron micrograph of a curved focusing grating coupler integrated into a surface trap according to an example embodiment as described herein. Simulations have predicted that such a coupler can achieve greater than 90% efficiency at, e.g., 435 nm with a beam waist of 2.0 µm. FIG. 12 is a perspective view showing the irradiation of a trapped ion by beams emerging from four respective apertures in the trap.

High optical loss in the alumina waveguides at 369 nm has been recognized as a potential obstacle to achieving desired levels of performance. However, we have established that with careful adjustment of process parameters, it is possible by atomic layer deposition (ALD) to fabricate low-loss alumina waveguides that are transparent at wavelengths as low as 402 and even as low as 369 nm.

Figure 13:
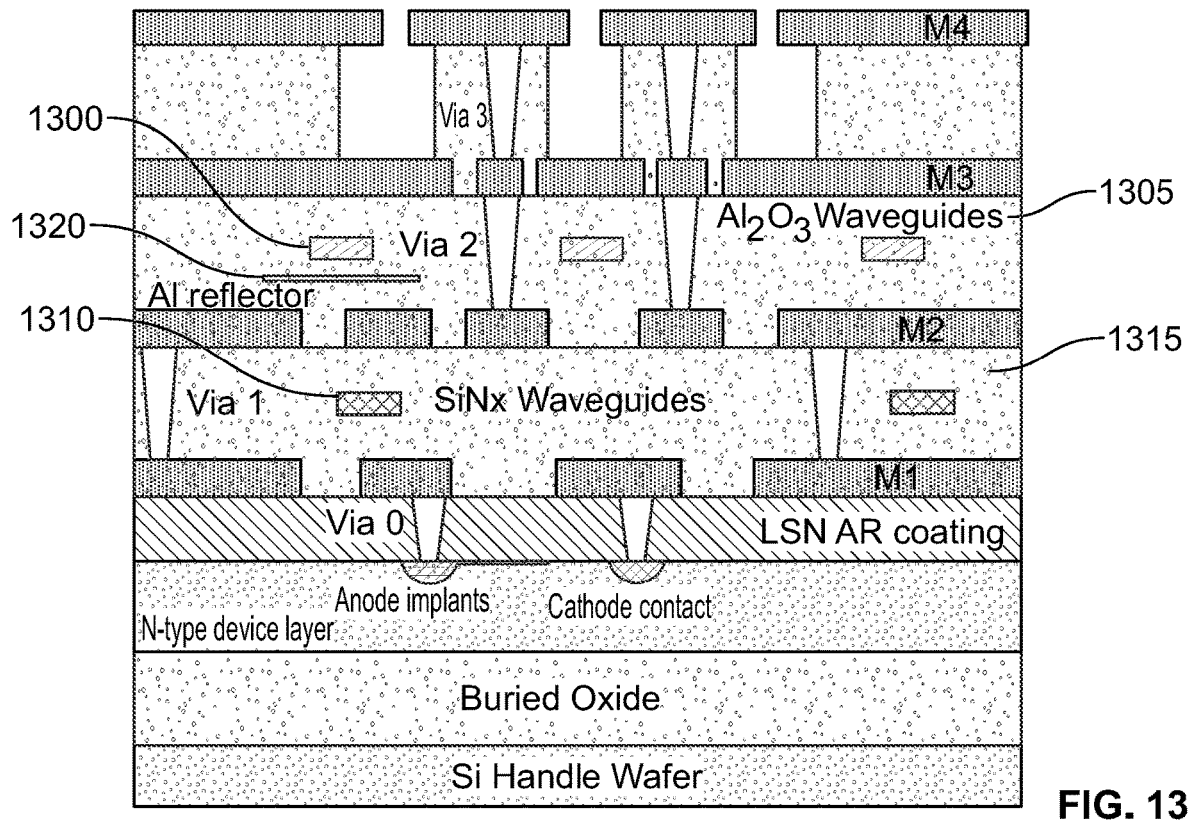
FIG. 13 is a simplified schematic diagram, in cross-sectional view, of a platform in an example embodiment of an ion trap that has four metal layers.

FIG. 13 is a simplified schematic diagram, in cross-sectional view, of a platform in an example embodiment that has four metal layers M1-M4. In the embodiment of FIG. 13, the alumina waveguides 1300 for light at 369 nm, 399 nm, and 435 nm are embedded in the intermetal dielectric 1305 between M2 and M3, and the waveguides 1310 for the repump light at 765 nm and 935 nm are embedded in the intermetal dielectric 1315 between M1 and M2. One possible advantage of placing the different types of waveguides in different levels of intermetal dielectric is that the waveguides can potentially be placed farther away from metal layers which could otherwise add propagation loss.

Aluminum reflectors are an optional feature. FIG. 13 shows aluminum reflectors 1320 embedded in the intermetal dielectric beneath selected alumina waveguides. Although potentially useful for all wavelengths, the reflectors could be especially useful in instances where laser power is limited.

Figure 14:
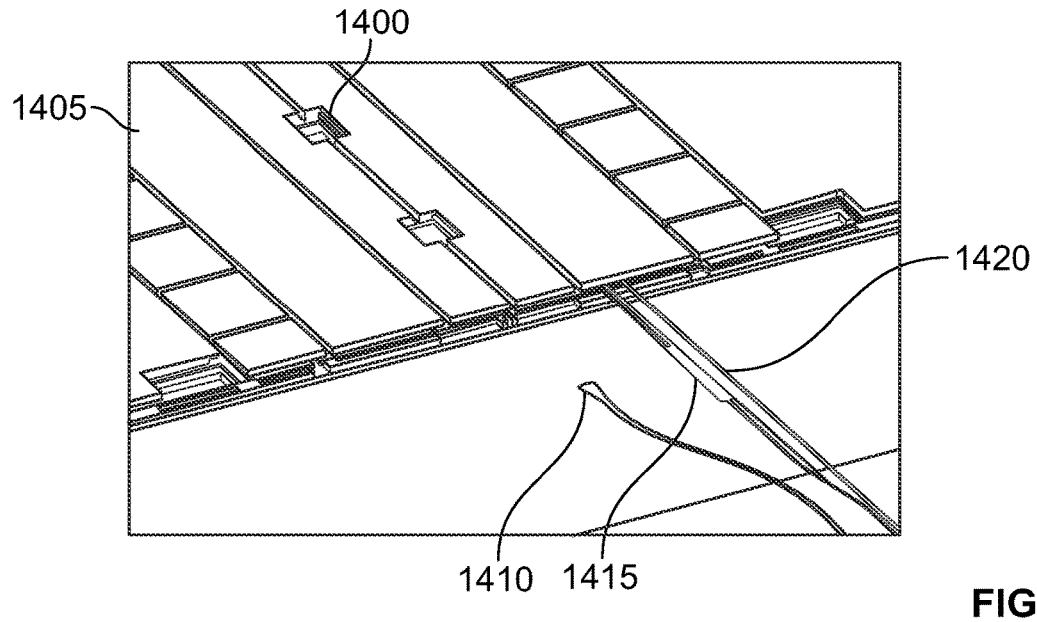
FIG. 14 is a perspective view showing optical apertures that open downward from the top metal in an example embodiment. The view is cut away to expose a portion of the upper waveguide layer, including a grating coupler, an MMI coupler, and portions of several waveguides.

FIG. 14 is a perspective view showing optical apertures 1400 that open downward from the top metal 1405. The view is cut away to expose a portion of the upper waveguide layer, including a grating coupler 1410, an MMI coupler 1415, and portions of several waveguides 1420.

Figure 15:
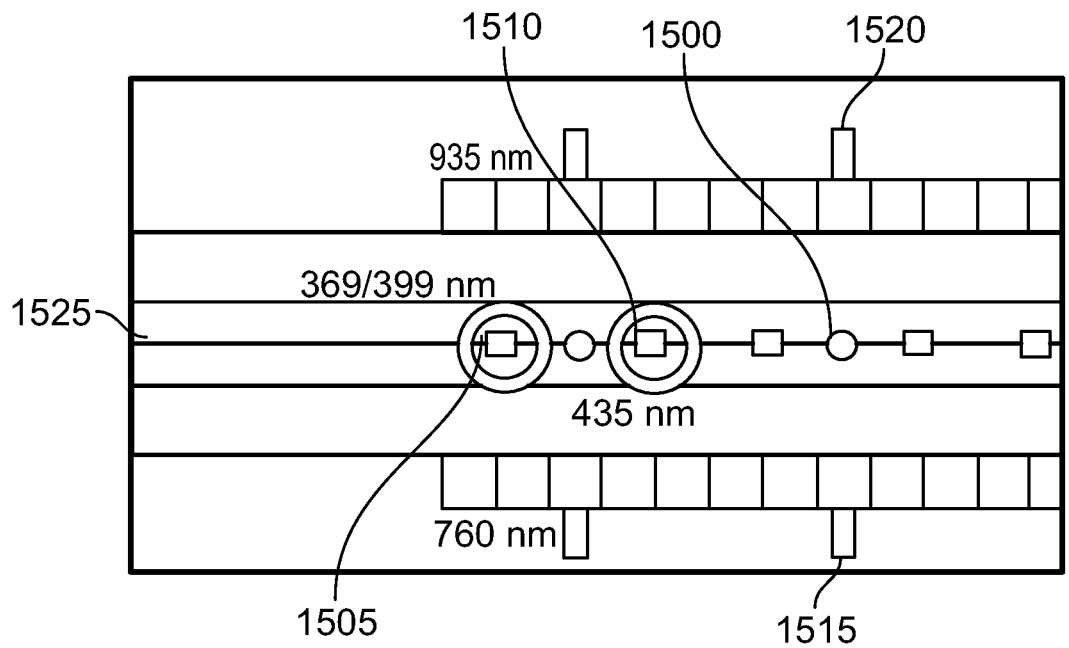
FIG. 15 is a plan view of the device of FIG. 14, showing the locations of the trapped ions, and showing the apertures for light at 369 nm and 399 nm, light at 435 nm, light at 760 nm, and light at 935 nm.

FIG. 15 is a plan view of the device of FIG. 14 showing the locations of the trapped ions 1500, and showing the apertures 1505, 1510, 1515, and 1520 for light at 369 nm and 399 nm, light at 435 nm, light at 760 nm, and light at 935 nm, respectively. It will be evident from the figure that the light beams at 369 nm and 399 nm, and the light beams at 435 nm, will be directed along the trap axis 1525.

Thus, in particular, the clock beam (at 435 nm) is delivered along the trap axis. This is desirable so that a tightly focused clock beam can impinge the ion even in the presence of fabrication nonuniformity.

One noteworthy feature of our ion trap, in various embodiments, is that scattered light can be suppressed by placing tungsten vias and metal layers around the waveguides to block stray light from impinging on the ion and on the single-photon avalanche detectors.

Optical Coupling

The 435-nm clock laser drives a quadrupole transition. Because quadrupole transitions are relatively weak, a tightly focused beam is desirable to reduce the amount of optical power required at the ion. In preferred designs, we therefore focus the 435-nm beam to a 2.5-µm beam waist, thereby to reduce the power required at the ion to 13 µW per site. Simulations predict that a 2.5-µm beam waist is readily achievable using focusing grating couplers, and that an efficiency better than 90% can also be achieved.

Tightly focusing the clock laser at the ion, however, has the drawback that it leaves scant room for aiming error. That is, the output angle of the focusing grating couplers will be sensitive to process variations and may vary accordingly. This cannot be compensated by varying the ion height, because the ion height is fixed by the RF design of the trap. However, come compensation is available by shifting the ion along the trap axis. Hence, we have found it advantageous to illuminate the ion with the clock laser emitted along the trap axis.

With the clock laser beam emitted along the trap axis, shifts in the output beam angle due to process variations can be compensated by linearly shifting the ion position. On the other hand, the repump beams and the beams for cooling and detection can be designed to have a larger beam waist, for example a waist of about 10 µm, which would assure that those beams would intersect at the ion position. This is possible because repump and cooling and detection have low saturation intensities.

For the clock to operate successfully, the intensity of the clock beam must be very uniform over an entire ionic ensemble. Desirably, the ensemble can be interrogated as a unit, without independent control of the optical intensity at each ionic position. However, process variations in the fabrication of the trap can cause variations in the output angles of the grating couplers that affect the optical intensities at the trapping sites.

We conducted preliminary measurements on wafers subjected to our processing, and we found that the shifts in the output angle were correlated over large spatial distances of 10 mm or more. This suggests that complications due to beam nonuniformity can be avoided.

However, approaches are possible that permit the clock to be operated successfully even when beam nonuniformity is significant.

That is, known multipulse protocols can correct for beam intensity errors. A suitable protocol for that purpose is the BB1 composite pulse sequence. See, e.g., C. M. Shappert et al., "Spatially uniform single-qubit gate operations with near-field microwaves and composite pulse compensation," *New Journal of Physics*, 2013, 15(8): p. 083053, the entirety of which is hereby incorporated herein by reference.

Integrated Waveguides

Silicon nitride ($SiN_x$) waveguides deliver the light at the near-infrared (NIR) wavelengths (i.e., the wavelengths 765 nm and 935 nm in the example described here). A silicon nitride waveguide having low loss for wavelengths in the NIR can be formed by plasma-enhanced chemical vapor deposition (PECVD). The low loss is achieved by tuning the relative flow rate between ammonia and silane during the deposition.

Figure 16:
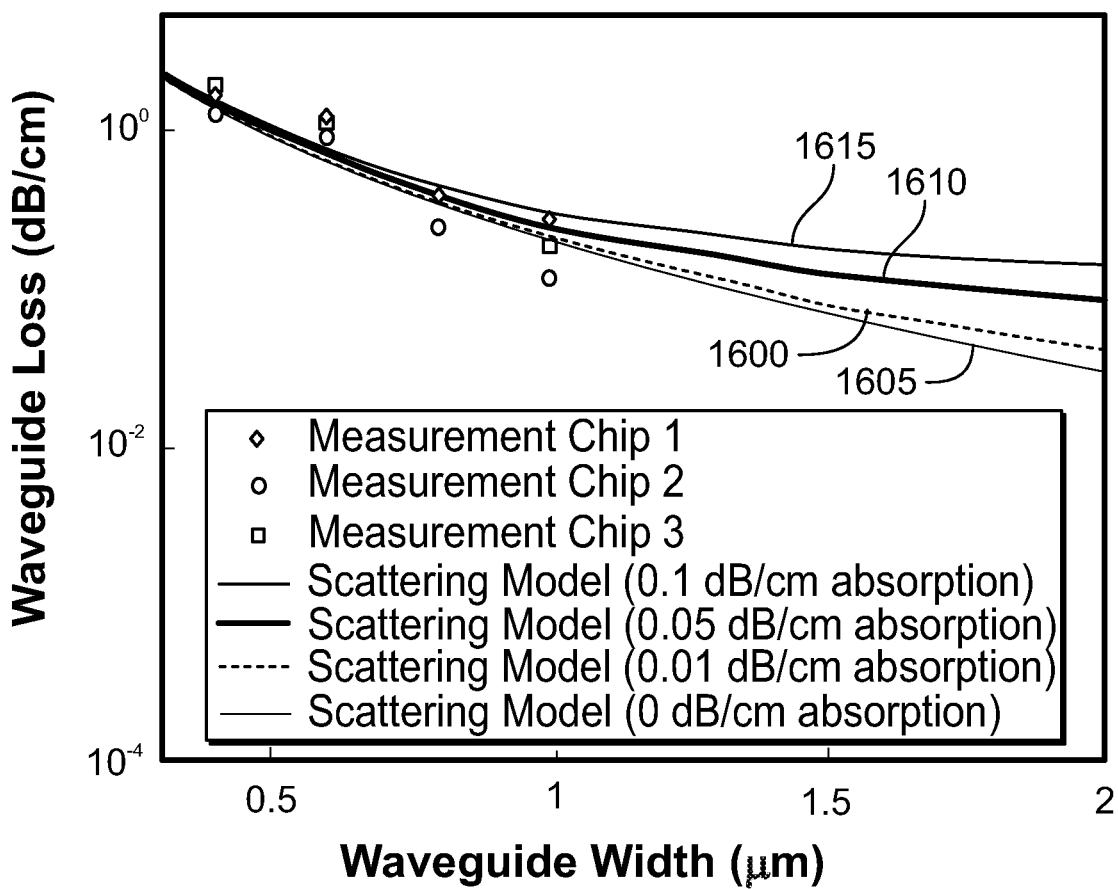
FIG. 16 is a graph of optical loss in silicon nitride waveguides as a function of the waveguide width at a wavelength of about 700 nm. The plotted data points represent experimental measurements. The continuous curves represent theoretical results from four different models for loss due to sidewall scattering and absorption. A best fit to the experimental data indicates that the losses due to absorption are approximately 0.01 dB/cm.

For example, we measured the waveguide loss for wavelengths of about 700 nm in three sample $SiN_x$ waveguides made by PECVD. The results are plotted as a function of waveguide width in FIG. 16. Four continuous curves in the figure were generated from numerical models for loss due to sidewall scattering and optical absorption. Curves 1600, 1605, 1610, and 1615 were modeled with respective absorption values of 0, 0.01, 0.05, and 01. dB/cm. A best match to the experimental data indicates that the absorption loss was closest to 0.01 dB/cm.

Alumina waveguides deliver the light at the ultraviolet (UV) wavelengths, for example at 369 nm, 399 nm and 435 nm. When formed by atomic layer deposition (ALD), alumina waveguides can exhibit a wide transparency window extending from the UV to the short-wave infrared (SWIR).

For example, recent studies at Sandia National Laboratories have demonstrated a loss as low as 1.3 dB/cm, or better, at a wavelength of 369 nm in single-mode waveguides having ALD alumina cores.

Alternatively, single-mode silicon nitride wavelengths can be used. We have observed propagation loss as low as 2.5 dB/cm in single mode silicon nitride waveguides at 405 nm.

Figure 17:
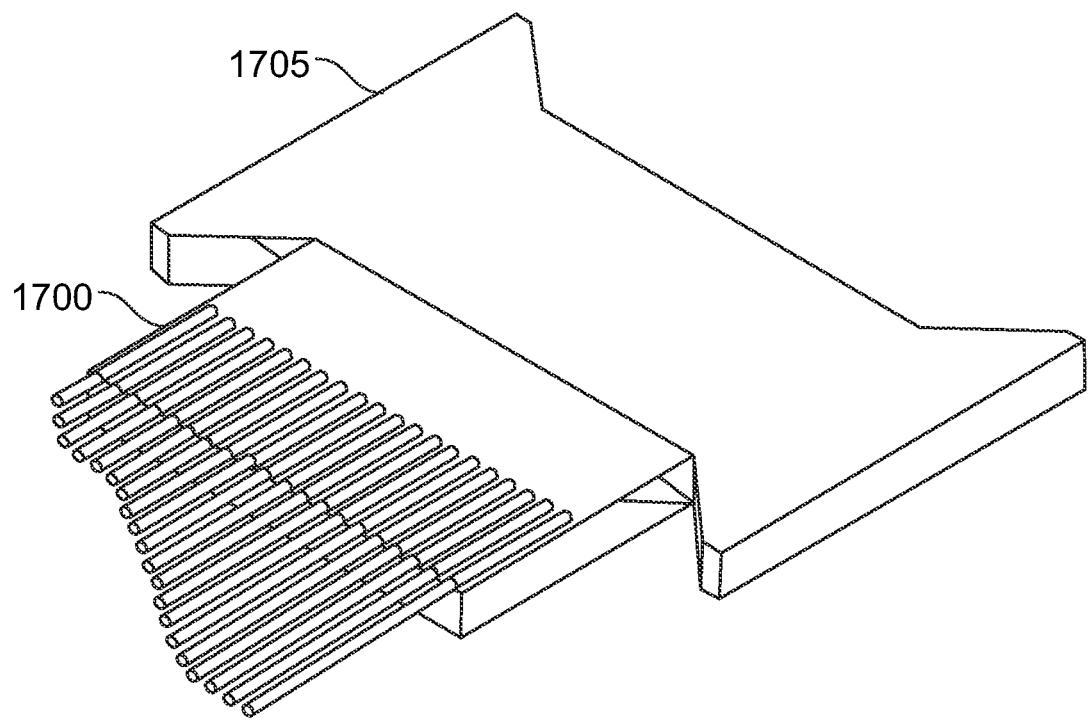
FIG. 17 is a perspective view of an example intermediate wafer useful in some embodiments for coupling of optical fibers. In the figure, the intermediate wafer is shown coupled to an ion-trap platform.

In our current design, optical fibers are used to transport light from the source lasers to the integrated waveguides, with butt coupling between fiber and waveguide. Several design refinements are also contemplated. For example, an intermediate wafer may be provided that includes V-grooves for fiber alignment to intermediate waveguides formed in the wafer that are coupled to the waveguides in the clock platform. One advantage of an intermediate wafer is that it reduces optical loss by increasing the separation between the optical fibers and the metallization in the clock platform. FIG. 17 is a perspective view of an example intermediate wafer 1700 coupled to the trap substrate 1705.

In another design refinement, the lasers are heterogeneously integrated with the clock platform and directly coupled to it without the use of fibers or an intermediate wafer.

Turning back to our current implementation, we believe that because only a few optical fibers are required to support clock operation, adequate coupling efficiency can be achieved with butt coupling of the fibers to the waveguides. For example, simulations predict that coupling losses better than 0.5 dB will be readily achieved for ALD alumina core waveguides. In practice, we have found that coupling loss as low as 5 dB can be achieved, limited primarily by photolithographic resolution. Taking variations in the fiber core and cladding and waveguide materials into account, we believe that even lower losses may be achievable, even losses as low as 1 dB.

Integrated Single-Photon Avalanche Detectors

Figure 18:
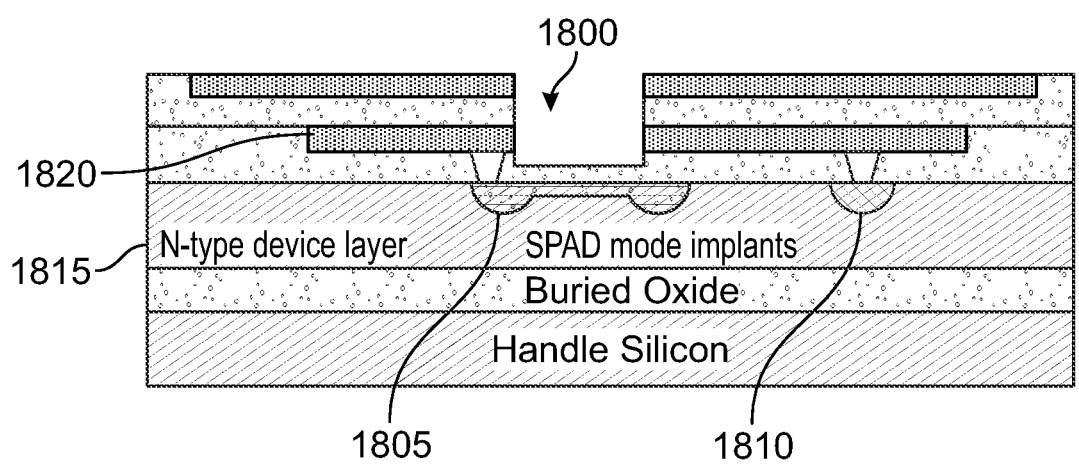
FIG. 18 is a notional cross-section, in elevational view, of a single-photon avalanche detector (SPAD) monolithically integrated in the center of an ion trap according to an example embodiment. For simplicity, only one metal level is shown for the trap electrodes, although multiple levels are required in practice.

As noted above, the detectors are monolithically integrated in our current design, although they may alternatively be added in a hybrid assembly. The monolithic concept is shown in FIG. 18, where the SPAD 1800 is located in the center of the trap. The doping implants 1805, 1810 required to implement SPADs are processed directly into the silicon device layer 1815 of the ion trap, and the first level 1820 of metal is used to route SPAD signals.

We have found it advantageous to subdivide the photodetector at each trapping site into a plurality of sectors, each consisting of a complete SPAD. For example, a single detection site may contain two halves or four quadrants, each containing one SPAD. Subdivision of that kind is useful for isolating defects. We have also found that dark count rates per unit area tend to decrease when using smaller-area diodes.

The SPAD device layer is overlain by a thermal oxide passivation layer and, if desired a low-stress silicon nitride (LSN) anti-reflection (AR) layer. The AR layer is optional, but it is highly preferred because according to our studies, it can improve the collection efficiency of the detector by as much as 50% or more. The intermetal dielectric is removed from above the antireflection layer to provide an optical path to the trapped ion that is void of material.

Photons are absorbed within about 50 nm from the front surface of the SPAD, generating electron-hole pairs within the p-type anode implant. Good passivation is required to prevent carrier recombination at the surface, so that the photogenerated electrons are able to drift into the high-field avalanche region and initiate a sustained carrier avalanche for Geiger-mode detection.

We have measured the single photon detection efficiency (SPDE) at a 405-nm wavelength and the dark count rate (DCR) for a 10-μm-diameter device as a function of temperature and overbias. We demonstrated an excellent SPDE of 0.7 with a DCR less than 10 Hz for temperatures less than 30° C.

Figure 19:
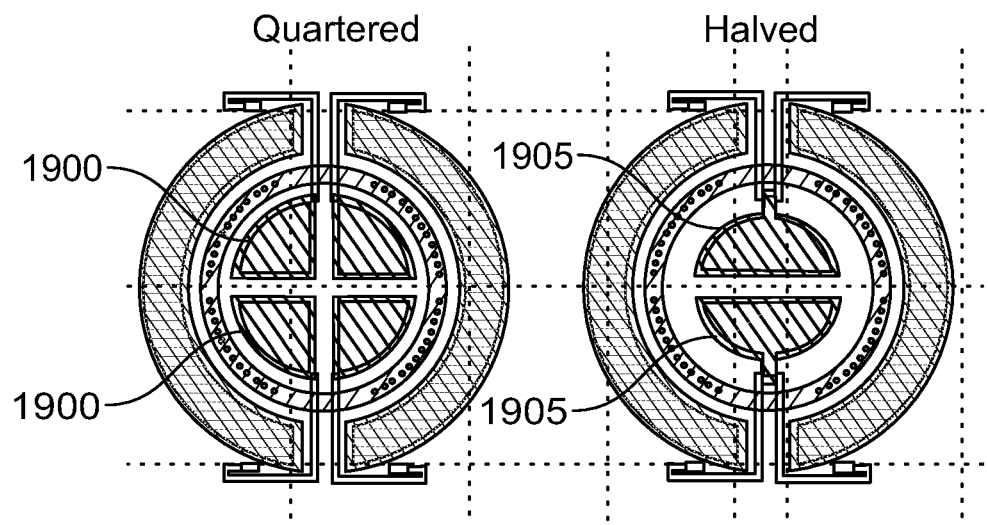
FIG. 19 is a layout diagram for two alternative versions of the SPAD design.

FIG. 19 is a layout diagram for two alternative versions of the SPAD design. On the left, four diode device regions 1900 are arranged below respective quadrants of the trapping site. On the right, two diode device regions 1905 are arranged below respective halves of the trapping site.

Compact Vacuum System

The vacuum package consists of a cap bonded directly to the ion trap chip. The material of the cap is not critical. It could be glass, e.g. borosilicate glass, or in other examples it could be made from a metal such as titanium. A glass window in the top to facilitate imaging of the ions is desirably included if, for example, the spacer, i.e. the remaining portion of the cap, is made from metal.

To bond the cap to the ion trap chip, we first pattern the chip with an annulus of gold over underlying metal adhesion layers. In a current implementation, the sequence of metals is titanium, then platinum, then gold. We also plate the rim of the, e.g., titanium cap with gold in the bonding region. Then the two gold surfaces are soldered together.

To maintain the background gas pressure at the desired level, the ultra-high vacuum (UHV) packaging should include appropriate pumping for the gas loads that arise within the system and that permeate through the vacuum system walls. Active pumping is desirable for management of helium and other noble gases, which passive pumping cannot manage effectively. Remaining gas loads can be managed with bulk non-evaporable getter pumps.

Figure 20:
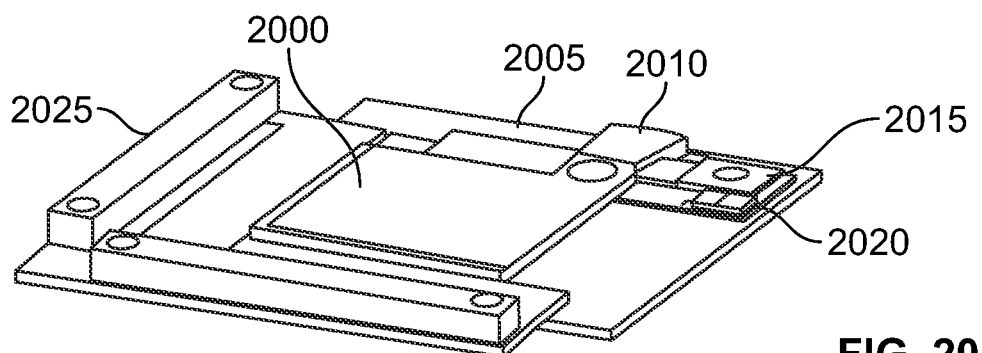
FIG. 20 is a simplified perspective view illustrating an example geometry for packaging an ion-trap platform with connection to a vacuum system. The ion trap substrate is shown mounted on a silicon interposer.
Figure 21:
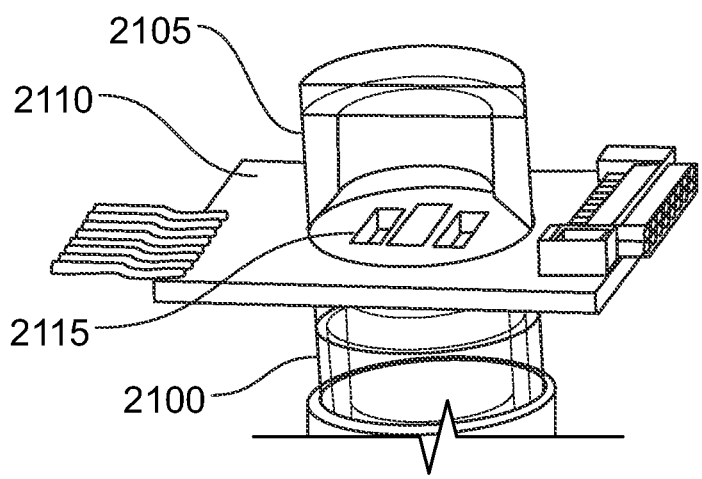
FIG. 21 is a simplified perspective view illustrating an example geometry for packaging an ion-trap platform with connection to a vacuum system. The ion trap is shown mounted on a vacuum inlet.

FIGS. 20 and 21 are simplified perspective views that illustrate an example geometry for packaging the platform with connection to a vacuum system. In FIG. 20, the ion trap substrate 2000 is shown mounted on a silicon interposer 2005. Coupled to the ion trap substrate are the frequency doubler 2010, the local oscillator and external resonator 2015, and the frequency comb 2020. Connectors 2025 for I/O are shown at the edges of the interposer.

In FIG. 21, the ion trap is shown mounted on a vacuum inlet 2100. The cap 2105 is shown bonded to the trap substrate 2110. On either side of the trapping region, apertures 2115 are shown for continuity of the vacuum from one side of the trap to the other.

Routing of Signals

The electrical signals are delivered onto the device substrate by wirebonding to bond pads on the substrate surface. Vias are used for vertical interconnections between the bond pads and buried traces, and between traces that are buried at different metallization levels.

In preferred designs, there are multiple metallization levels to facilitate electrical routing. Our current design has three metallization levels, but as many as five levels are envisaged for future designs, and even more levels are possible.

It is important to note that by using vias for vertical connection to buried metallization layers, we are able to route a large number of electrical signals beneath the vacuum seal for communication between the interior and the exterior of the vacuum chamber, without using any feedthroughs. On the exterior of the vacuum chamber, we can readily fanout the various electrical signals to convenient connection points on an interposer chip or the like.

Optical signals are delivered over optical fiber. In non-limiting examples, the fibers are aligned and coupled using V-groove arrays. Each V-groove is designed to align the end of an optical fiber to the face of a waveguide formed in the ion trap chip.

All electrical and optical connections are external to the vacuum, so as to eliminate the need for feedthroughs and free-space optics.

Yb Source

A miniaturized Yb evaporative source is included within the vacuum package. Any of various designs can be used for the evaporative source. One non-limiting example of an evaporative source suitable in this regard is described in P. D. D. Schwindt et al., "A highly miniaturized vacuum package for a trapped ion atomic clock," *Review of Scientific Instruments,* 2016. 87(5), 053112, the entirety of which is hereby incorporated herein by reference.

The miniature Yb source described in Schwindt et al., cited above, uses a silicon micro-hotplate structure built from a silicon-on-insulator (SOI) wafer. Deep reactive ion etching (DRIE) is used to define a mechanical cup-like holding structure for Yb. Pt/ZnO high-temperature wiring is deposited on the device front side to produce the heating element. Yb is deposited into the hotplate cup using a miniature evaporation process. When the process is optimized, 20% to 40% of the Yb can be transferred into the cup.

FIGS. 22A and 22B provide images of the front (FIG. 22A) and back (FIG. 22B) of the micro-hotplate.

Electrical power can be delivered to the device by either wire bonding or soldering to the gold coated electrodes 2200.

We have demonstrated that we can reduce the size of the micro-hotplate cups to as low as 0.7 mm. A typical fill for the cup is 0.2 to 0.5 mg of Yb.

Operating Temperature

In principle, the ion clock is operable at room temperature. However, cooling may be required if the dark count rate from the photodetectors is excessive at room temperature.

As those skilled in the art will recognize, laser cooling will, in operation, place the trapped ions near their ground state energy. Thus, irrespective of the ambient temperature, the trapped ions will be at an equivalent temperature in the microkelvin range.

Example 1: SPAD Integration

FIG. 23 is a cross-sectional schematic drawing of an example prototype of an ion-trap platform according to the principles discussed here. As seen in the drawing, there are three metal levels whose thicknesses in bottom-to-top sequence from M1 to M3 are 2600 nm, 1350 nm, and 2600 nm. The three layers of dielectric, in bottom-to-top sequence, have thicknesses of 1000 nm, 2400 nm, and 2000 nm.

The silicon nitride waveguides 2300 are 250 nm thick and lie 800 nm above the top of M1 and 1350 nm below the bottom of M2. The alumina waveguides 2305 are 150 nm thick and lie 1450 nm above the top of M1 and 800 nm below the bottom of M2. These dimensions are critical because placing the waveguides too close to the metal layers can cause optical loss.

Figure 24:
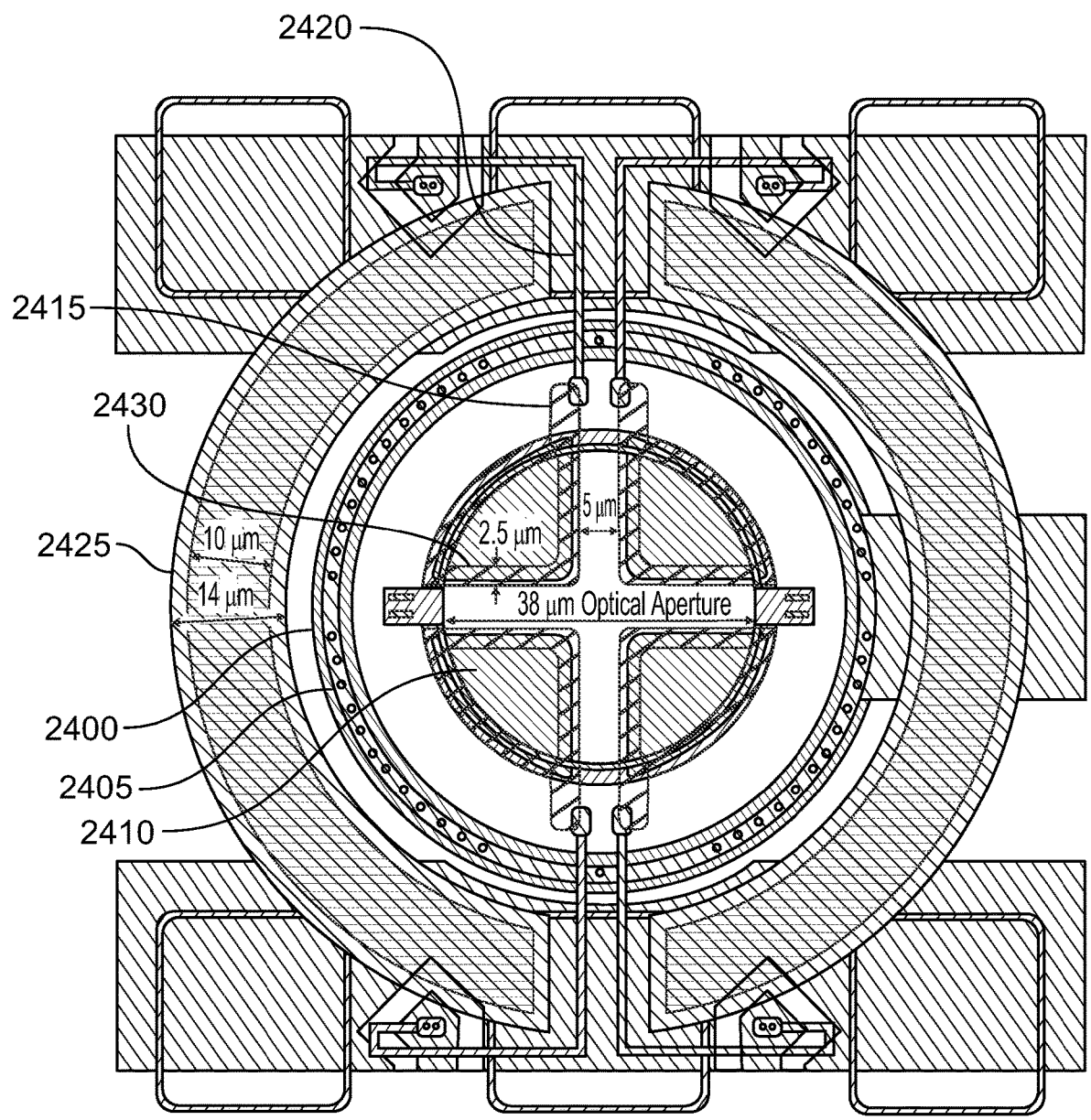
FIG. 24 is a plan view of an example SPAD designed for integration on an ion-trap platform.

FIG. 24 is a plan view of a SPAD that we designed for integration on the ion-trap platform. The optical aperture of the detector is 38 µm in diameter. In order to keep dark-count rate acceptably low, either four or two SPAD devices are employed to fill the optical aperture. We refer to these, respectively, as the "quad" device and the "half" device.

It has been empirically observed that dark count rates increase as a greater-than-linear function of either SPAD area or SPAD perimeter. Hence, a subdivided aperture gives a lower aggregate dark-count rate than a single 40-µm-diameter detector, although this is achieved at the cost of lower aggregate photon detection efficiency (PDE), due to gaps between the individual SPADS.

The SPAD shown in FIG. 24 is a quad device. The best dark-count rate we have measured, to date, for a quad device is 454 Hz. For comparison, our best measured dark-count rate for a half device is 6800 Hz.

Turning to FIG. 24, it will be seen that the elements of the SPAD include a substrate implant region 2400 with substrate contacts 2405, boron-implanted anodes 2410 with anode contacts 2415, polysilicon quench resistors 2420, polysilicon getter 2425, and a 2.5-µm boron deep-implanted guard ring 2430.

The contacts to the anodes are made using implant tabs that are outside of the optical aperture. This is necessary to avoid interference with a continuous tungsten etch stop. The perimeters of the anode implants receive additional deep boron implants (i.e., the "deep guard ring implants") to reduce the electric field and thus prevent premature device breakdown at anode edges.

The polysilicon quench resistors are integrated with the device to quench breakdown events. The resistors are 1 µm wide by 60 µm in total length, providing about 300 kΩ per resistor.

The optical aperture and anodes are surrounded by a substrate contact ring, which serves as the cathode contact to the device.

Surrounding the substrate contact ring is the polysilicon getter. We believe this feature will be useful for removing impurities in the vicinity of the active silicon, although its effectiveness has not yet been confirmed. The getter is a 10-μm-wide ring of polysilicon. This ring fills a trench in the oxide layer that overlies the silicon surface and extends down to contact the silicon surface. To assure that the polysilicon completely fills the trench, it is advantageous to extend the deposited polysilicon to a diameter slightly larger than the trench. As seen in the figure, this produced a 2-μm-wide shoulder on each side of the trench in the example that is illustrated. The ring is broken at top and bottom to allow escape of the quench resistors.

The SPAD is fabricated using standard CMOS techniques that are well known in the art and need not be described here in detail.

The silicon device layer of the SPAD is overlain by an antireflective (AR) layer of silicon nitride and silicon dioxide, which is not shown in FIG. 24.

One of the conventional process steps for fabricating the SPAD involves wet etching to remove the intermetal dielectric of silicon oxide from above the SPAD. We believe that the quality of the AR layer is critical. To protect it during the wet etch, we added a step of depositing titanium nitride (TiN) as a temporary protective layer for the AR layer. The etchant for the intermetal dielectric leaves the TiN in place. A subsequent etching step removes the TiN. This process is described in greater detail below.

FIGS. 25-33 are schematic cross-sections that illustrate selected stages in the CMOS processing to create the ion-trap platform with integrated SPADs.

Figure 25:
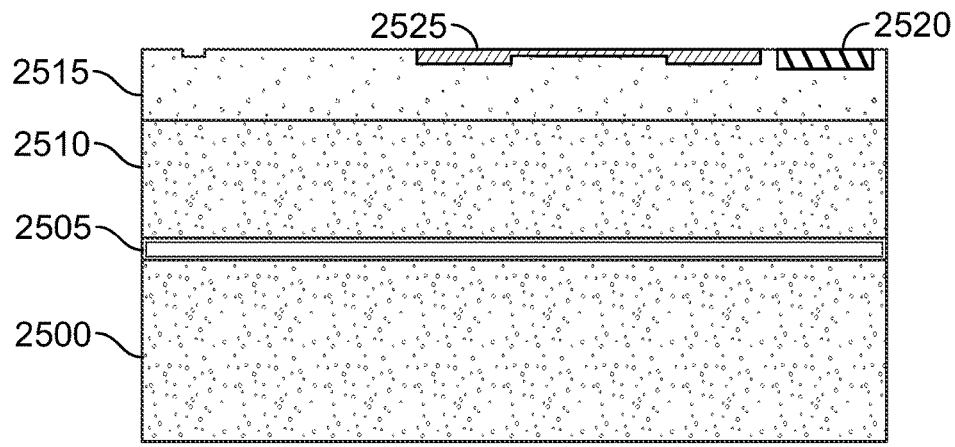
FIGS. 25-33 are schematic cross-sections that illustrate selected stages in a CMOS processing sequence for fabricating an ion-trap platform with integrated SPADs.

At FIG. 25, the starting wafer is shown after boron and phosphorus implants for the active regions and the contacts. An example starting wafer is an SOI wafer with a 700-μm n-type silicon handle layer 2500, a 1-μm buried oxide layer 2505, and a 20-μm n-type silicon device layer 2510 on which there is grown a 5-μm epitaxial layer 2515 of silicon doped with arsenic to $3\times10^{16}$ cm$^{-3}$. The n-type phosphorus-doped region 2520 is seen near the edge of the wafer, and the p-type boron-doped region 2525 is seen near the center of the wafer in the view of the figure.

Figure 26:
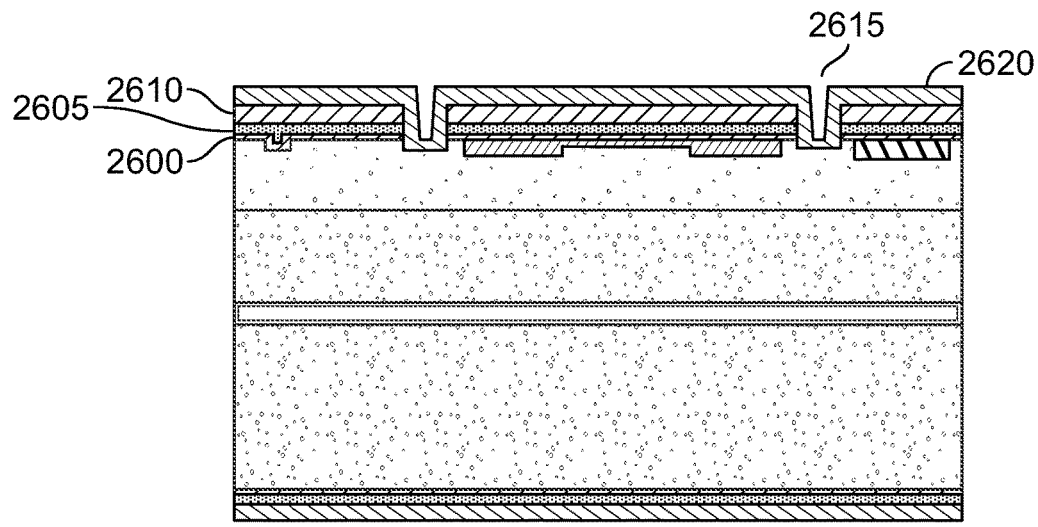

At FIG. 26, the wafer is shown overcoated, in sequence, with a 10-nm layer of thermal silicon oxide 2600, a 32-nm layer 2605 of silicon nitride (SiN), and a 300-nm layer 2610 of HDP oxide. A trench 2615 is etched for the polycrystalline silicon getter, and a 300-nm layer 2620 of polycrystalline silicon is deposited. The thermal oxide and the SiN constitute the AR layer. The polycrystalline silicon constitutes the getter and the quench resistors. Phosphorus is implanted for the resistors, and arsenic is implanted for the resistor contacts.

Figure 27:
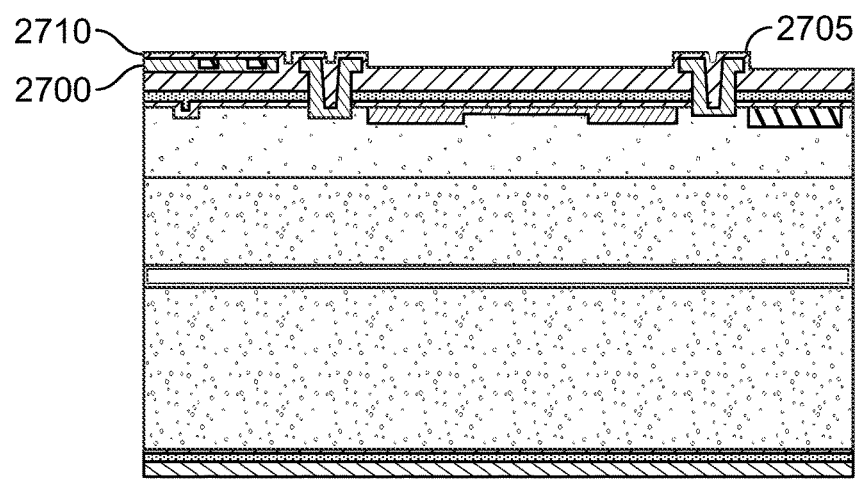

At FIG. 27, the resistors 2700 and the getter 2705 have been defined, and a 100-nm protective layer 2710 of HDP oxide has been deposited.

Figure 28:
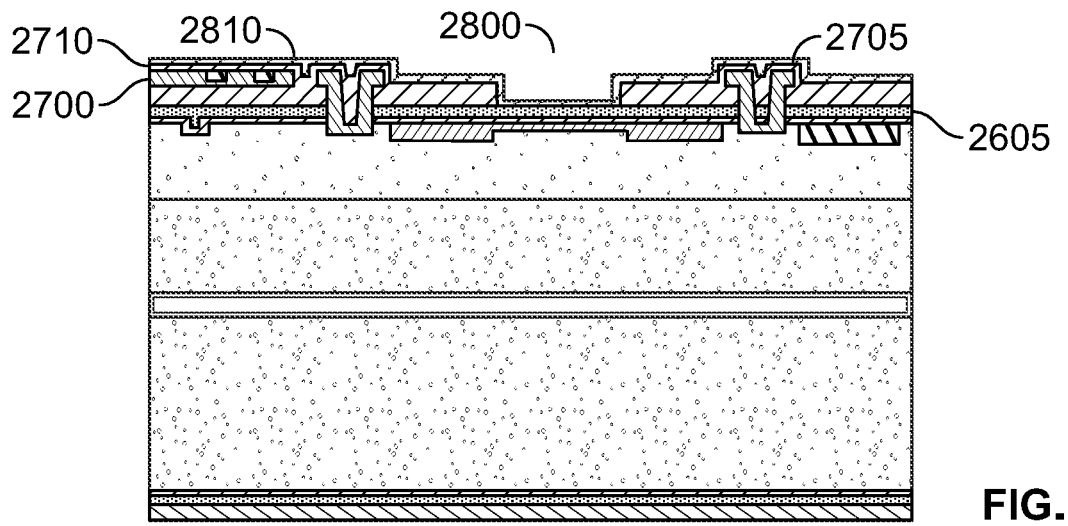

At FIG. 28, an opening 2800 has been etched down to the silicon nitride layer 2605 by a dry etch followed by a wet etch. A 150-nm layer 2810 of TiN has been deposited by chemical vapor deposition (CVD) followed by plasma vapor deposition (PVD).

Figure 29:
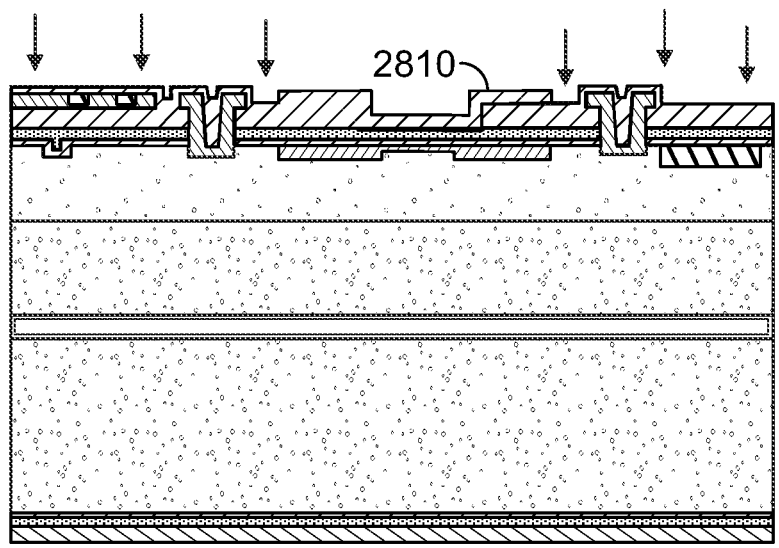

At FIG. 29, the TiN layer 2810 has been defined by wet etching.

Figure 30:
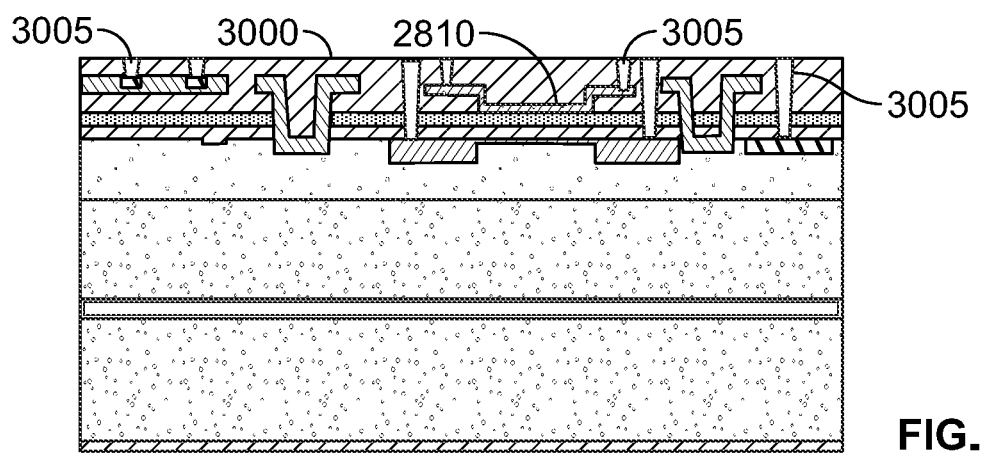

At FIG. 30, a 300-nm layer 3000 of HDP oxide has been deposited, and tungsten vias 3005 have been formed.

Figure 31:
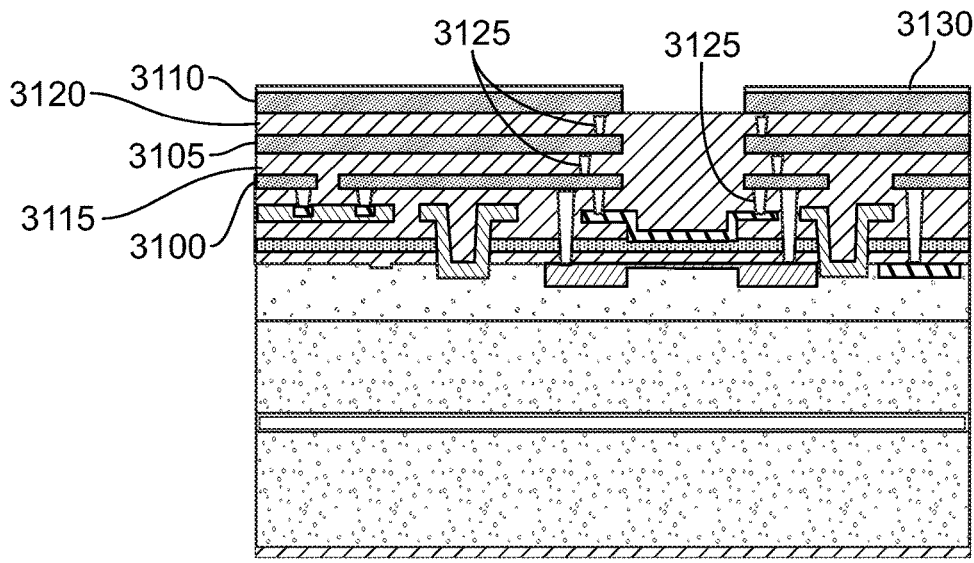

At FIG. 31, layers 3100-3110 corresponding to metallization layers M1, M2, and M3 have been added, together with their intermetal dielectric 3115, 3120, and further tungsten vias have been added, including the sacrificial vias 3125 seen in the drawing. In the figure, a hard mask 3130 of PETEOS is also seen overlying M3. The fabrication of the waveguides is not shown in this series of drawings.

Figure 32:
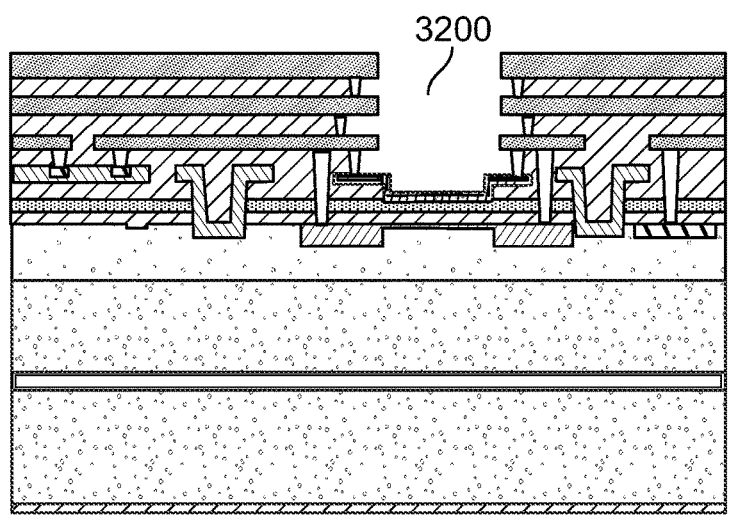

At FIG. 32, the etching process that releases the traps has also opened the aperture 3200 (i.e., the optical window) down to the TiN layer.

Figure 33:
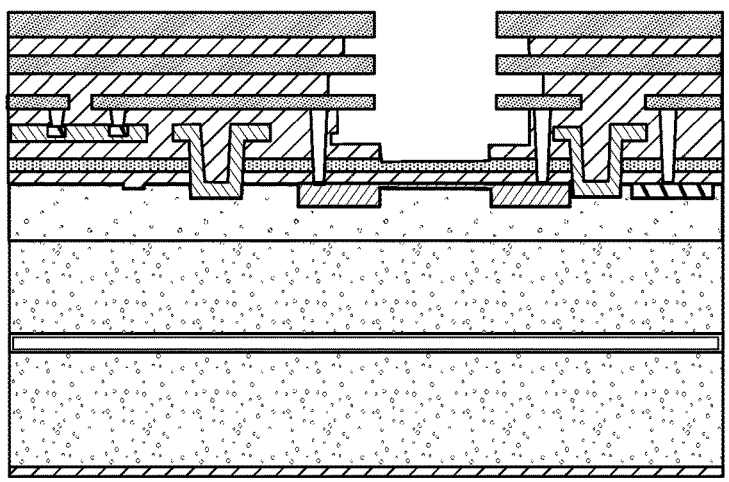

At FIG. 33, further etching removes the sacrificial vias and the TiN layer.

In the example, the alumina gratings for light at 369 nm and for light at 435 nm are designed for a beam angle of 46.1° from the normal, focused on a spot at a height of 50.4 μm with a full width at half-maximum (FWHM) of 4.6 μm for the 369-nm light and a FWHM of 3.3 μm for the 435-nm light.

In an example design, the 300-nm light is carried by the same waveguides that carry the 369-nm light. In an alternative design, a dedicated waveguide delivers the 399-nm light (which is used solely for photoionization during ion loading) to a special trapping site where the photoionization takes place. The ions are shuttled from there to the trapping sites for the clock.

The silicon nitride gratings for light at 760 nm and 935 nm are designed fora beam angle of 20° from the horizontal. They are designed for a relaxed focus at the ion height of 50.4 μm. In design variations, a collimated beam could be used in place of a focused beam.

Example 2: Grating Coupler Design

We designed optical grating couplers to produce beams that would diffract from the gratings in such a way as to focus at the location of the trapped ion. The design angles and spot sizes for the five different wavelengths that we used are listed in Table 1 below.

For each of our designs, the desired focal point was 50.4 μm above the surface of the top metal of the ion trap. To reduce stray light from the 369-nm beam, we choose a non-focusing design (i.e. a design with focus at infinity) for that wavelength. We also chose non-focusing designs for the near-infrared wavelengths, because those wavelengths did not require high intensity.

We tried several different design techniques for the gratings.

One technique that we tried was the apodization technique described in K. K. Mehta et al., "Precise and diffraction-limited waveguide-to-free-space focusing gratings," *Sci Rep* 7, 2019 (2017), https://doi.org/10.1038/s41598-017-02169-2.

Another technique that we tried was an adjoint optimization routine, utilizing the lumopt Python package, described in C. M. Lalau-Keraly et al., "Adjoint shape optimization applied to electromagnetic design," *Opt. Express* 21, 21693-21701 (2013).

However, our most successful designs were based on an iterative technique of our own devising. According to that technique, each grating tooth is defined by finding that curve which maintains a constant effective optical path length for propagation from the input of the grating slab, through any point on the grating tooth, to the desired focal point.

Each grating tooth has an effective index of refraction with a value between the index of the surrounding cladding material and the effective index of an infinite 2D slab of the waveguiding material. This grating-tooth effective index will affect the optical path length of light which passes through it and scatters from downstream grating teeth. As a consequence, each grating tooth must be defined after the previous grating teeth have been defined, based on an optical path length calculated using the effective indices of the previous teeth. These sequential calculations make our procedure iterative in nature.

A better understanding of our procedure can be obtained with reference to FIGS. 34 and 35. As seen in FIG. 34, we begin with a tapered waveguide region which extends in the xy-plane from the input waveguide at location (0,0,0). The tapered waveguide region expands in the xy-plane with increasing distance along the x-axis, up to a limit defined by the length L, which sets the location of the end of the taper region along the x-axis.

With further reference to the figure, the total optical path length associated with the location (L,0,0) is (A+B). The length (A+B) is calculated as the sum of:

the length of the taper (L) multiplied by the effective index of the waveguide slab ($n_{eff}$), plus a weighted value of the distance from the end of the taper to the focal point, where the weighted value is obtained by multiplying the distance by the refractive index of any material located along this path.

This path length is divided by the wavelength and rounded to the nearest integer to provide a grating tooth order number, m.

We then solve for the curve which remains in the plane z=0 and maintains this constant path length. In the case of constant effective index along optical path lengths A and B, this corresponds to the intersection of an ellipsoid of revolution (i.e., a spheroid) and a plane. For the generation of grating teeth, however, the effective index along the path length varies. As a consequence, the solution becomes non-analytic.

Once this curve has been determined, it is used to draw the end of the tapered region with a defined transverse width (i.e. taper angle). The first grating tooth is then generated by increasing the order of the grating tooth by one unit (i.e., m→m+1). This provides an incremental increase of one optical wavelength in the optical path length.

A new curve is numerically generated in the plane z=0 and designed to maintain this new path length between the grating input and the focal point. With reference to FIG. 35, the effective optical length A is now the sum of:

the effective index of the waveguide slab ($n_{eff}$), multiplied by the taper length L, plus an additional path length from the end of the taper region to the first tooth, multiplied by the effective index of this additional path length.

The effective index of this additional path length is estimated using a weighted average of the slab waveguide effective index and the index of the cladding material, based on a desired grating duty cycle (DC).

In the current example, the duty cycle DC was maintained constant from tooth to tooth of the grating. However, it is noteworthy in this regard that in principle, the duty cycle could vary from tooth to tooth. Such variation has the potential advantage of modulating the scattering strengths of the affected teeth, and thus could potentially allow shaping of the intensity profile of the scattered light for better performance.

It should be noted in this regard that although the duty cycle was constant in this example, the tooth width was not. The tooth width changes because the spacing between teeth changes. That is, the spacing changes along the length of the grating, and also within a single pair of grating teeth.

In a more complex but potentially more accurate procedure, the effective refractive indices of the teeth are refined through iteration. That is, after initially calculating the grating tooth curve based on the estimated effective index, a new effective index of the tooth is calculated based on the current iteration of the curve and used to generate a new curve for the next iteration. This procedure is iterated to reach a desired level of accuracy.

The curve in its final iteration is then used to draw the first grating tooth. The grating tooth order is again increased by one unit, and a second grating tooth is generated in a similar manner, now accounting for the optical path length of the taper region and the first and second tooth. This routine is iterated until the desired number of grating teeth have been generated.

TABLE 1

| Wavelength | Angle from Trap Surface | Target Spot size |
| --- | --- | --- |
| 369 nm | 57.0° | >5 μm (non-focusing) |
| 399 nm | 43.9° | 3.3 μm |
| 435 nm | 43.9° | 3.3 μm |
| 760 nm | 21.4° | >20 μm (non-focusing) |
| 935 nm | 21.4° | >20 μm (non-focusing) |

We claim:

1. An apparatus, comprising:
a surface electrode ion trap fabricated on a substrate and conformed to provide a plurality of trapping sites for ionic host systems;
a plurality of optical waveguides monolithically integrated on the substrate and conformed to deliver light to the trapping sites;
a plurality of electrical routing traces defined in one or more metallization levels integrated on the substrate and conformed to deliver electrical signals to electrodes of the surface electrode ion trap; and
a plurality of active semiconductor photodetectors integrated on the substrate below the trapping sites and receivingly optically coupled to respective trapping sites for detecting light therefrom.

2. The apparatus of claim 1, wherein the ionic host systems are $^{171}Yb^+$ ions.

3. The apparatus of claim 1, wherein the plurality of optical waveguides comprises waveguides for a plurality of ultraviolet beams and waveguides for a plurality of infrared beams.

4. The apparatus of claim 3, wherein the plurality of ultraviolet beams comprises beams for a clock signal, for Doppler cooling, for detection, and for photoionization, and wherein the plurality of infrared beams comprises repump beams.

5. The apparatus of claim 3, wherein the optical waveguides for the ultraviolet beams have alumina cores, and the optical waveguides for the infrared beams have silicon nitride cores.

6. The apparatus of claim 1, wherein the photodetectors are single-photon avalanche detectors (SPADs).

7. The apparatus of claim 6, wherein the SPADs are monolithically integrated on the substrate.

8. The apparatus of claim 7, wherein the SPADs are integrated below respective trapping sites.

9. The apparatus of claim 6, wherein the SPADs are incorporated on the substrate by hybrid integration.

10. The apparatus of claim 1, further comprising a vacuum vessel directly bonded to the substrate, a plurality of wirebond pads formed on the substrate, and a plurality of waveguide terminations defined in the substrate, wherein the wirebond pads and the waveguide terminations are situated outside the vacuum vessel, and the wirebond pads are connected by vias to buried metallization layers.

11. The apparatus of claim 10, wherein the waveguide terminations are adapted for coupling buried waveguides to optical fibers.

12. The apparatus of claim 1, further comprising at least one metal reflector monolithically integrated on the substrate and arranged to enhance optical coupling of one or more of the optical waveguides to one or more of the trapping sites.

13. The apparatus of claim 1, wherein at least some of the monolithically integrated optical waveguides are terminated by grating couplers, and wherein each of the grating couplers is adapted to couple light out of its respective waveguide and to form the outcoupled light into a beam directed to a trapping site.

14. The apparatus of claim 1, wherein the plurality of optical waveguides comprises waveguides for a plurality of ultraviolet beams embedded within an intermetal dielectric layer and waveguides for a plurality of infrared beams embedded within an intermetal dielectric layer.

15. The apparatus of claim 14, wherein the waveguides for ultraviolet beams and the waveguides for infrared beams are embedded at different heights within the same intermetal dielectric layer.

16. The apparatus of claim 14, wherein the waveguides for ultraviolet beams and the waveguides for infrared beams are embedded within different intermetal dielectric layers.

17. The apparatus of claim 1, wherein: the substrate has a silicon device layer, each photodetector integrated on the substrate is formed in the silicon device layer, and each said photodetector is positioned at the bottom of an aperture so as to have, in operation, a direct line of sight to an ion trapped above the aperture.

18. The apparatus of claim 1, wherein the trapping sites are arranged in at least two arrays for respective ensembles of trapped ions, and wherein the plurality of monolithically integrated optical waveguides comprises, for each said array, at least one trunk waveguide for delivering light to its array and a plurality of branch waveguides for delivering light from the trunk waveguide to individual trapping sites of the array.

19. A method of operating an optically controlled atomic clock apparatus of the kind in which feedback for stabilizing a local oscillator is provided by interrogating ions confined in a surface electrode ion trap fabricated on a surface of a substrate, comprising:
  electrically activating the surface electrode ion trap through a plurality of electrical routing traces defined in one or more metallization levels integrated on the substrate and conformed to deliver electrical signals to electrodes of the surface electrode ion trap;
  interrogating a plurality of ions confined at respective trapping sites, using light delivered through a plurality of optical waveguides monolithically integrated on the substrate; and
  detecting fluorescence from the plurality of confined ions, using a plurality of photodetectors integrated on the substrate and arranged to detect light from respective trapping sites.

20. The method of claim 19, wherein the interrogating is performed concurrently over an ensemble of two or more of the confined ions.

* * * * *